(12) United States Patent
Kim et al.

(10) Patent No.: US 11,094,660 B2
(45) Date of Patent: Aug. 17, 2021

(54) SEMICONDUCTOR PACKAGE

(71) Applicant: SAMSUNG ELECTRONICS CO., LTD., Suwon-si (KR)

(72) Inventors: Jung Soo Kim, Suwon-si (KR); Pyung Hwa Han, Suwon-si (KR); Sung Hawn Bae, Suwon-si (KR); Jin Won Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 16/560,311

(22) Filed: Sep. 4, 2019

(65) Prior Publication Data

US 2020/0118959 A1 Apr. 16, 2020

(30) Foreign Application Priority Data

Oct. 12, 2018 (KR) .................. 10-2018-0122060

(51) Int. Cl.
*H01L 21/48* (2006.01)
*H01L 23/00* (2006.01)
(Continued)

(52) U.S. Cl.
CPC .......... *H01L 24/20* (2013.01); *H01L 21/4853* (2013.01); *H01L 21/4857* (2013.01); *H01L 21/568* (2013.01); *H01L 21/6836* (2013.01); *H01L 23/13* (2013.01); *H01L 23/3128* (2013.01); *H01L 23/3135* (2013.01);
(Continued)

(58) Field of Classification Search
CPC ..... H01L 24/20; H01L 24/19; H01L 23/3135; H01L 23/49816; H01L 23/13; H01L 23/49838; H01L 23/49822; H01L 23/3128; H01L 23/562; H01L 23/5389; H01L 25/16; H01L 21/4857; H01L 21/4853; H01L 2924/19102; H01L 2924/3025; H01L 2225/1041; H01L 2225/1058; H01L 2224/12105; H01L 2224/04105

See application file for complete search history.

(56) References Cited

U.S. PATENT DOCUMENTS

2005/0218502 A1 10/2005 Sunohara et al.
2009/0237900 A1* 9/2009 Origuchi ................ H01L 24/82
361/763

(Continued)

FOREIGN PATENT DOCUMENTS

JP 2005-294383 A 10/2005

*Primary Examiner* — Sitaramarao S Yechuri
(74) *Attorney, Agent, or Firm* — Sughrue Mion, PLLC

(57) ABSTRACT

A semiconductor package includes: a connection structure having first and second surfaces opposing each other and including a redistribution layer; a semiconductor chip disposed on the first surface of the connection structure and having connection pads connected to the redistribution layer; an encapsulant disposed on the first surface of the connection structure and encapsulating the semiconductor chip; a passivation layer disposed on the second surface of the connection structure and having a plurality of first and second openings exposing, respectively, first and second regions of the redistribution layer; and a plurality of under-bump metal layers connected to the first region of the redistribution layer through the plurality of first openings, respectively.

17 Claims, 16 Drawing Sheets

(51) Int. Cl.
   *H01L 23/31*    (2006.01)
   *H01L 23/498*   (2006.01)
   *H01L 25/16*    (2006.01)
   *H01L 23/13*    (2006.01)
   *H01L 21/683*   (2006.01)
   *H01L 21/56*    (2006.01)

(52) U.S. Cl.
   CPC .. *H01L 23/49816* (2013.01); *H01L 23/49822* (2013.01); *H01L 23/49838* (2013.01); *H01L 24/19* (2013.01); *H01L 25/16* (2013.01); *H01L 2221/68345* (2013.01); *H01L 2221/68359* (2013.01); *H01L 2924/19102* (2013.01)

(56) References Cited

U.S. PATENT DOCUMENTS

| | | | |
|---|---|---|---|
| 2013/0249589 A1* | 9/2013 | Chen | H01L 22/14 |
| | | | 324/762.01 |
| 2014/0091428 A1 | 4/2014 | Hossain et al. | |
| 2017/0033090 A1* | 2/2017 | Hsieh | H01L 25/50 |
| 2017/0040266 A1* | 2/2017 | Lin | H01L 23/5383 |
| 2017/0271248 A1* | 9/2017 | Chen | H01L 21/486 |
| 2017/0317053 A1* | 11/2017 | Hung | H01L 21/31053 |
| 2018/0025985 A1* | 1/2018 | Lin | H01L 23/66 |
| | | | 257/659 |
| 2018/0061813 A1* | 3/2018 | Hsieh | H01L 23/28 |
| 2019/0164783 A1* | 5/2019 | Huang | H01L 24/24 |

* cited by examiner

I-I'

SEMICONDUCTOR PACKAGE

CROSS-REFERENCE TO RELATED APPLICATION(S)

This application claims the benefit of priority to Korean Patent Application No. 10-2018-0122060 filed on Oct. 12, 2018 in the Korean Intellectual Property Office, the entire disclosure of which is incorporated herein by reference.

TECHNICAL FIELD

The present disclosure relates to a semiconductor package.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded. One type of package technology suggested to satisfy the technical demand as described above may be a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a semiconductor package in which a problem due to mounting of a surface mount component may be solved.

According to an aspect of the present disclosure, a semiconductor package may include: a connection structure having first and second surfaces opposing each other and including a redistribution layer; a semiconductor chip disposed on the first surface of the connection structure and having connection pads connected to the redistribution layer; an encapsulant disposed on the first surface of the connection structure and encapsulating the semiconductor chip; a passivation layer disposed on the second surface of the connection structure and having a plurality of first and second openings exposing, respectively, first and second regions of the redistribution layer; and a plurality of underbump metal layers connected to the first region of the redistribution layer through the plurality of first openings, respectively.

According to another aspect of the present disclosure, a semiconductor package may include: a connection structure having first and second surfaces opposing each other and including a redistribution layer; a semiconductor chip disposed on the first surface of the connection structure and having connection pads connected to the redistribution layer; an encapsulant disposed on the first surface of the connection structure and encapsulating the semiconductor chip; a passivation layer disposed on the second surface of the connection structure and having a plurality of first and second openings each opening one region of the redistribution layer; a plurality of first underbump metal layers connected to the redistribution layer through the plurality of first openings, respectively; a plurality of second underbump metal layers connected to the redistribution layer, and disposed along inner sidewalls of the plurality of second openings such that the plurality of second underbump metal layers have concave portions; a plurality of first electrical connection metals disposed on the passivation layer and connected to the plurality of first underbump metal layers, respectively; a plurality of second electrical connection metals filling at least portions of the concave portions of the plurality of second underbump metal layers; and at least one surface mount component disposed on the passivation layer and having connection terminals connected to the plurality of second electrical connection metals.

According to still another aspect of the present disclosure, a semiconductor package may include: a connection structure having first and second surfaces opposing each other and including a redistribution layer; a semiconductor chip disposed on the first surface of the connection structure and having connection pads connected to the redistribution layer; an encapsulant disposed on the first surface of the connection structure and encapsulating the semiconductor chip; a passivation layer disposed on the second surface of the connection structure and having a plurality of first and second openings to expose, respectively, first and second regions of the redistribution layer; and a plurality of first and second electrical connection metals disposed on the second surface of the connection structure and electrically connected to the first and second regions of the redistribution layer, respectively. The plurality of first and second electrical connection metals are disposed on different height levels from each other in a stacking direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
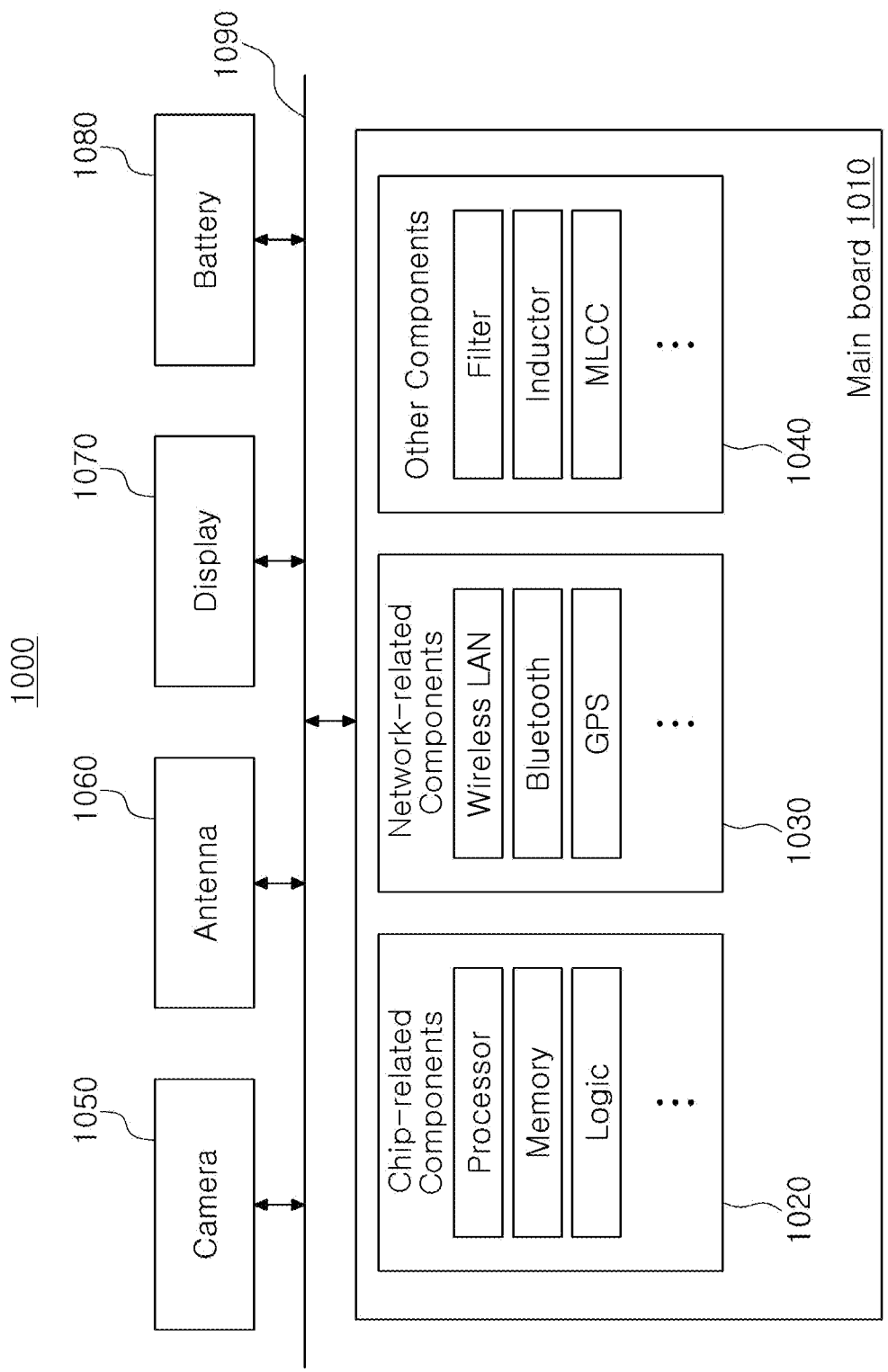
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
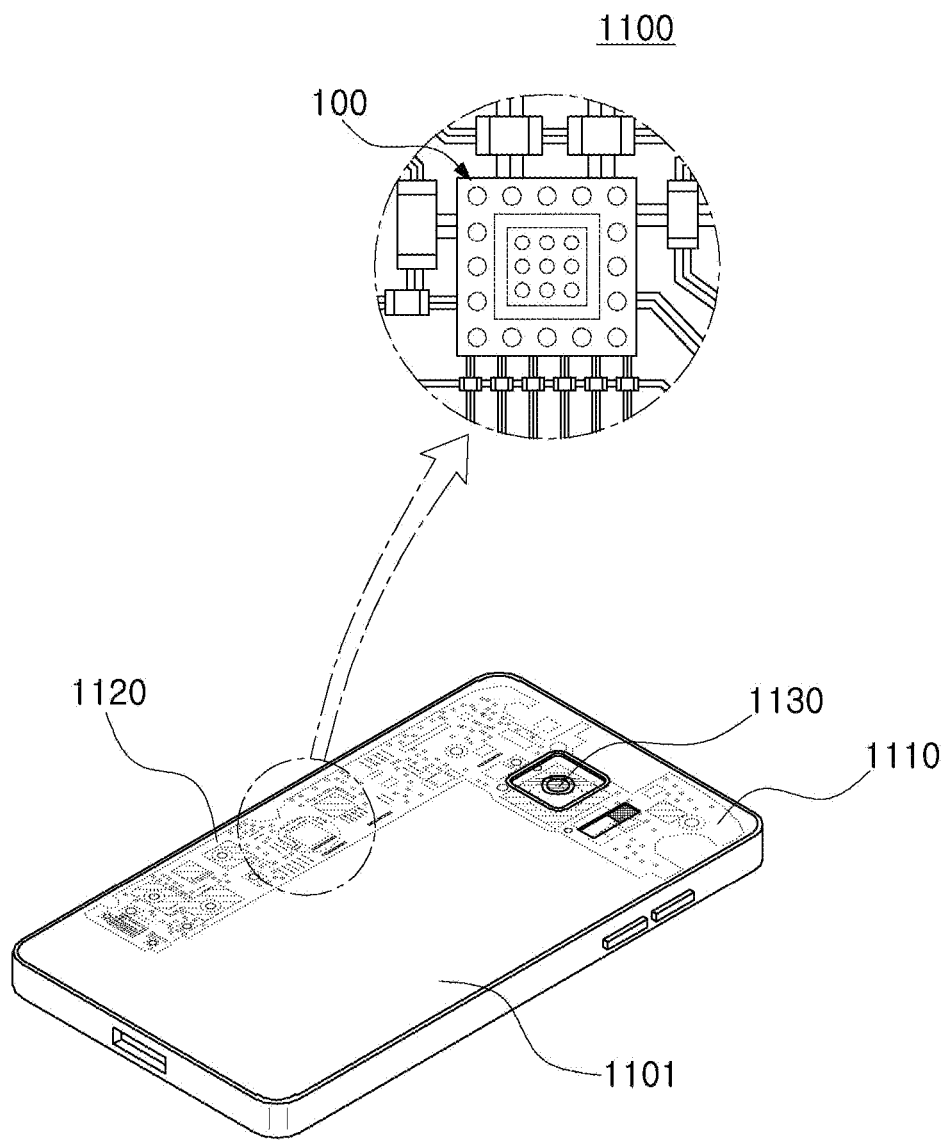
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-In Semiconductor Package

Figure 3B:
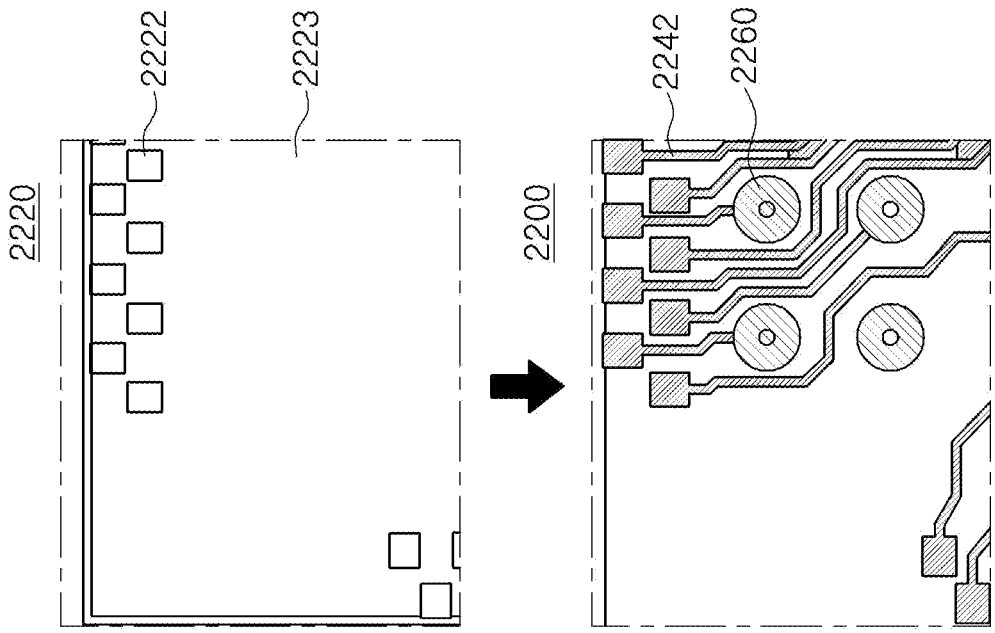
FIGS. 3A and 3B are schematic cross-sectional views illustrating states of a fan-in semiconductor package before and after being packaged.
Figure 3A:
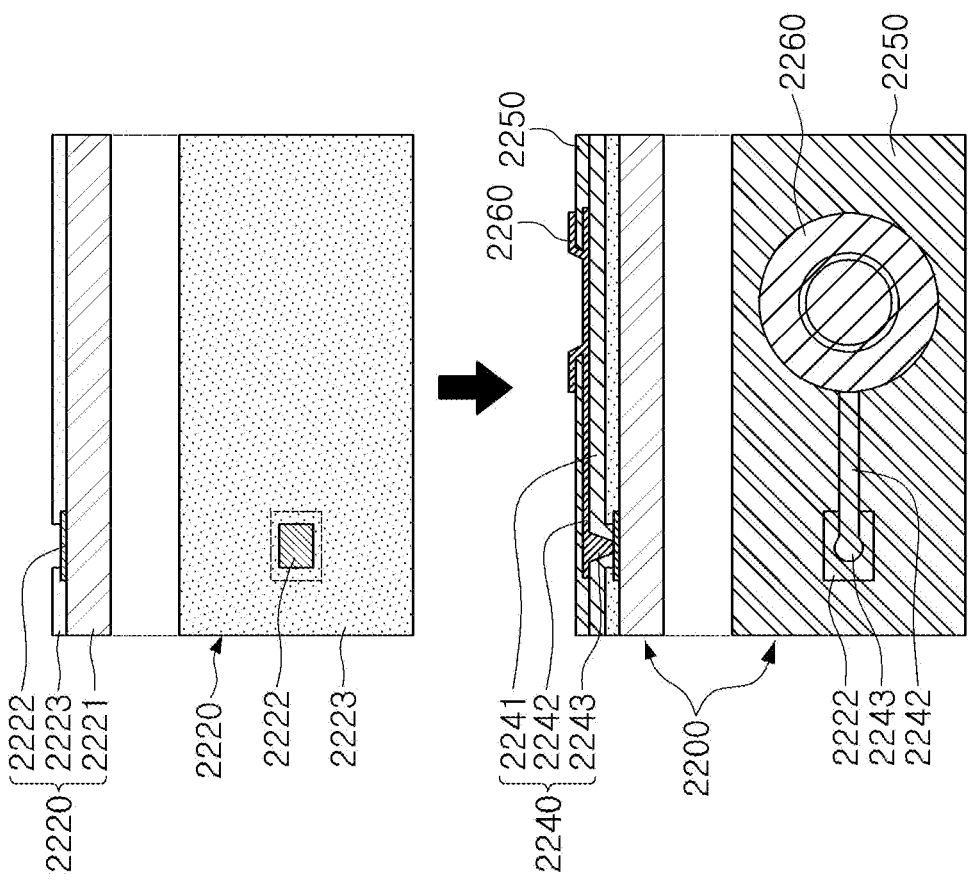
Figure 4:
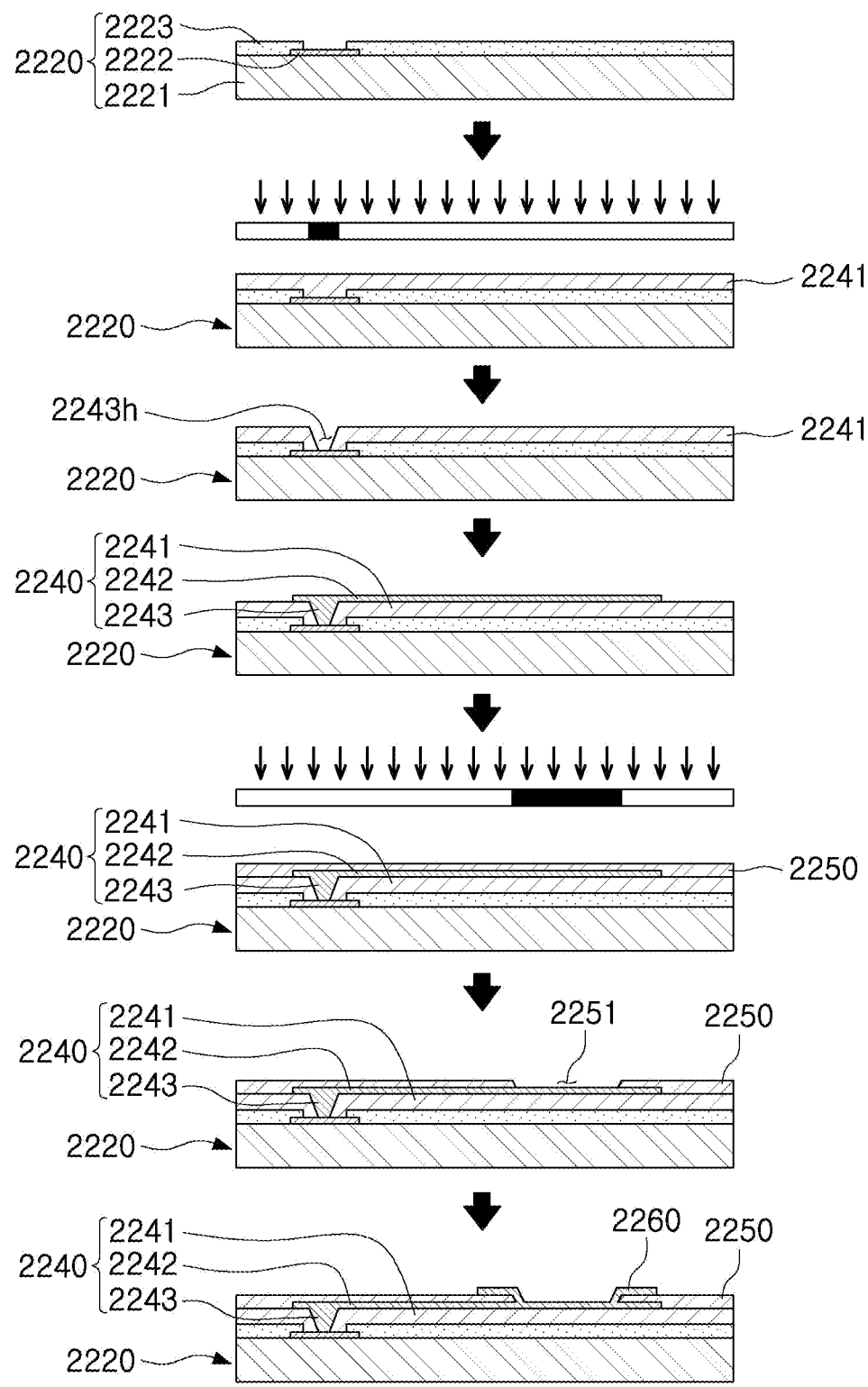
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
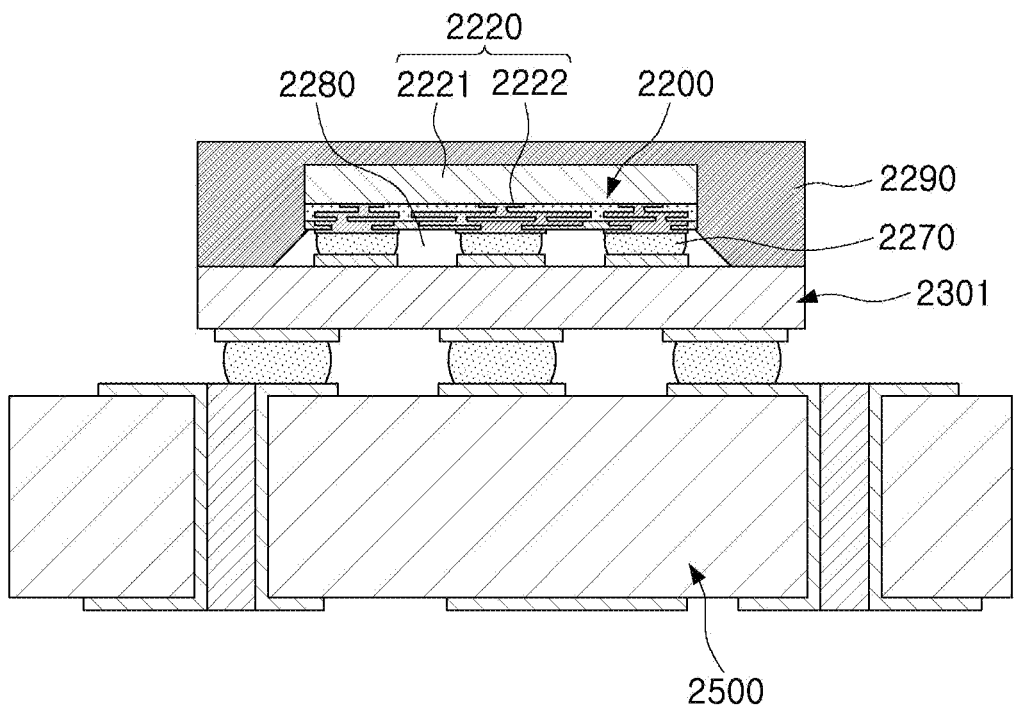
FIG. 5 is a schematic cross-sectional view illustrating a case in which a fan-in semiconductor package is mounted on an interposer substrate and is ultimately mounted on a mainboard of an electronic device.
Figure 6:
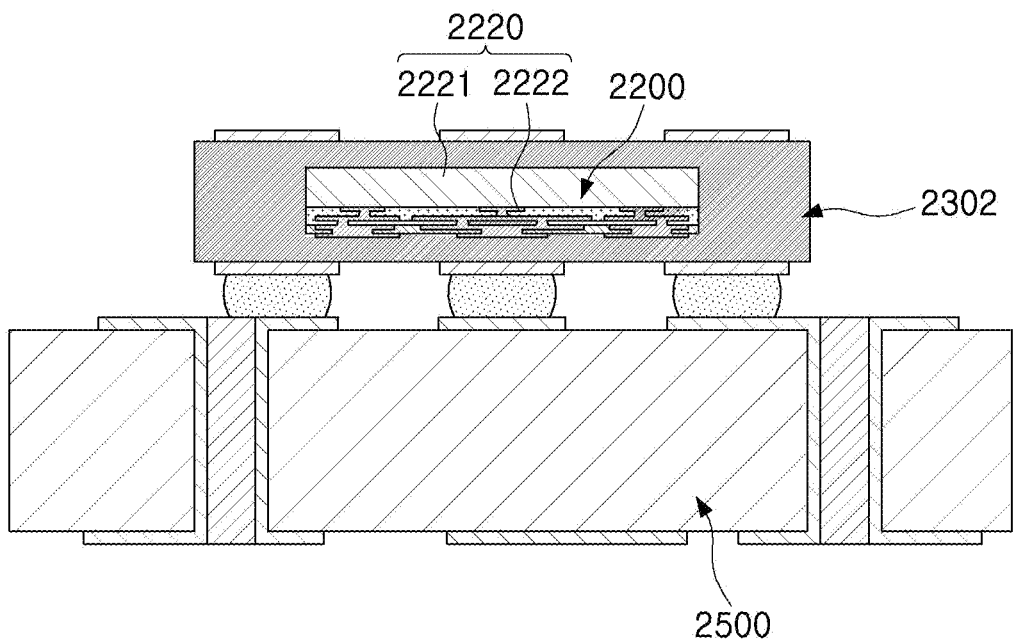
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
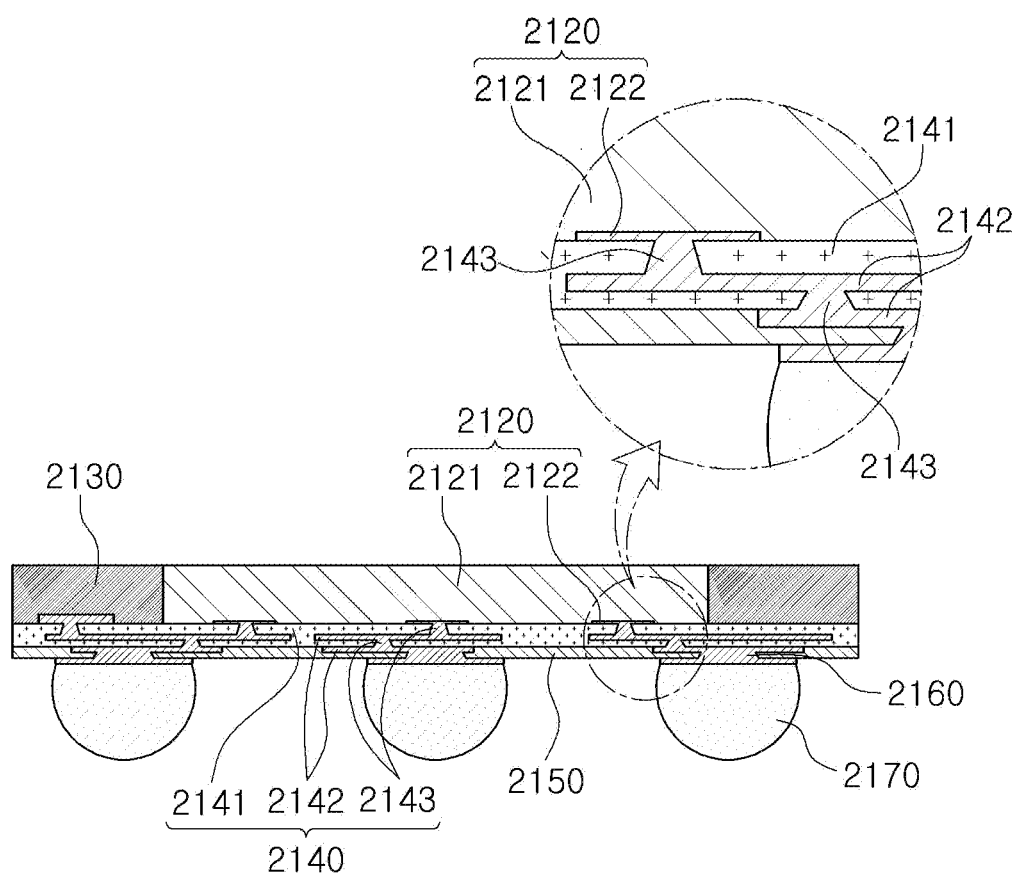
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Low melting point metal or alloy balls 2170 may be further formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, the connection structure 2140 may be formed after the semiconductor chip 2120 is encapsulated, and the vias 2143 connected to the redistribution layers may thus have a width that becomes small as they become close to the semiconductor chip (see an enlarged region).

As described above, the fan-out semiconductor package may have I/O terminals of the semiconductor chip redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
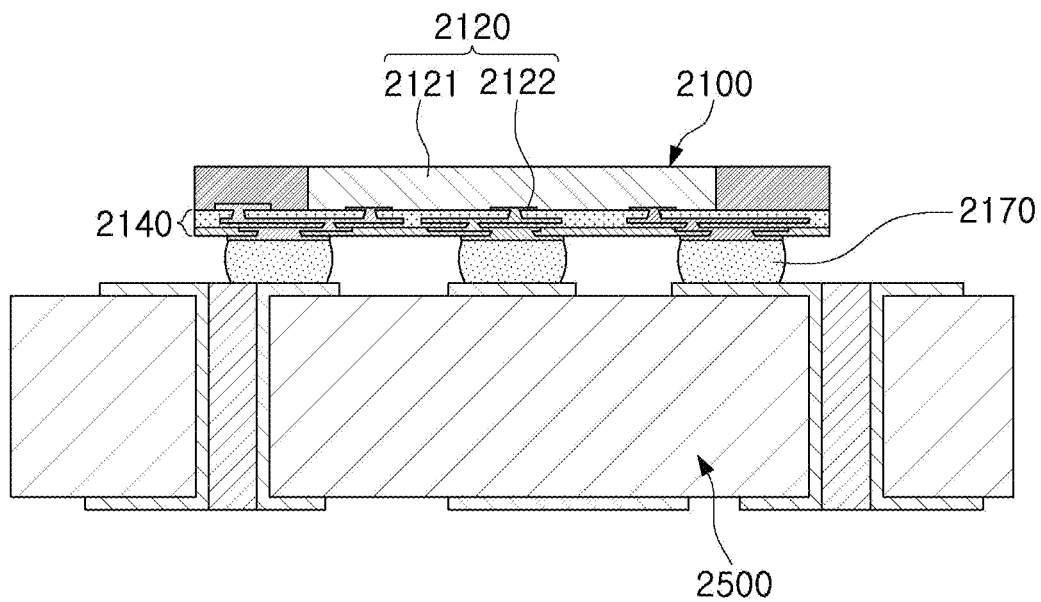
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
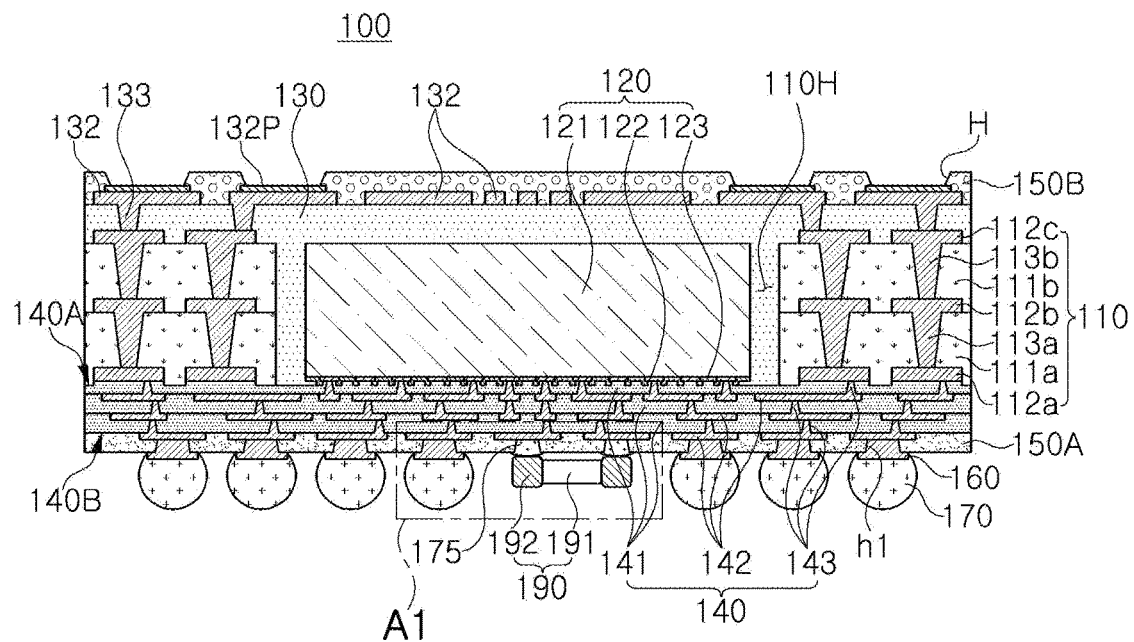
FIG. 9 is a schematic cross-sectional view illustrating a semiconductor package according to an exemplary embodiment in the present disclosure.
Figure 10:
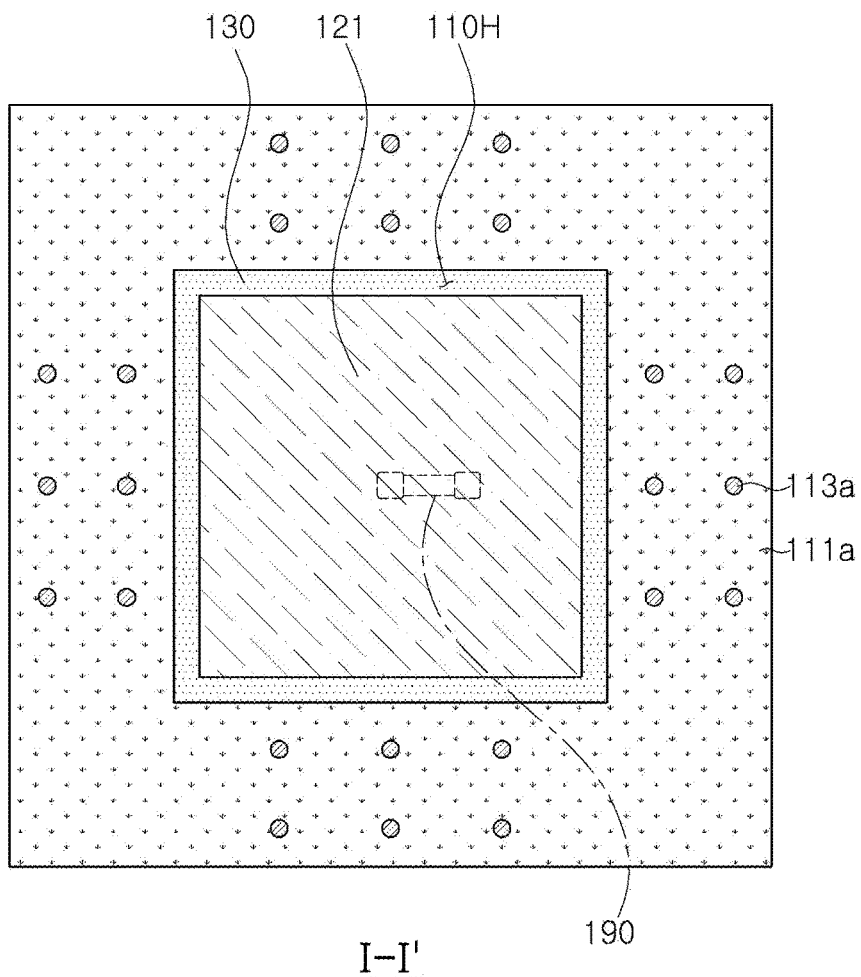
FIG. 10 is a plan view taken along line I-I' of the semiconductor package of FIG. 9.

FIG. 9 is a schematic cross-sectional view illustrating a semiconductor package according to an exemplary embodiment in the present disclosure, and FIG. 10 is a plan view taken along line I-I' of the semiconductor package of FIG. 9.

Referring to FIGS. 9 and 10, a semiconductor package 100 according to the present exemplary embodiment may include a connection structure 140 having a first surface 140A and a second surface 140B opposing each other, a semiconductor chip 120 disposed on the first surface 140A of the connection structure 140, and an encapsulant 130 disposed on the first surface 140A of the connection structure 140 and encapsulating the semiconductor chip 120.

The semiconductor package 100 may further include a frame 110, a wiring pattern layer 132, wiring vias 133, a surface mount component 190, underbump metal layers (hereinafter, referred to as 'first underbump metal layers')

160, first electrical connection metals 170, second electrical connection metals 175, and first and second passivation layers 150A and 150B.

The connection structure 140 may include three-layered redistribution layers 142, and connection pads 122 of the semiconductor chip 120 disposed on the first surface 140A of the connection structure 140 may be connected to the redistribution layers 142.

The frame 110 may be disposed on the first surface 140A of the connection structure 140, and the semiconductor chip 120 may be accommodated in a cavity 110H of the frame. The frame 110 may have a wiring structure including three-layered wiring layers 112a, 112b, and 112c and wiring vias 113a and 113b connecting the three-layered wiring layers 112a, 112b, and 112c to each other. The wiring structure of the frame 110 may be connected to the redistribution layer 142 of the connection structure 140.

The first passivation layer 150A may be formed on the second surface 140B of the connection structure 140. The passivation layer 150A may have openings 150h opening at least portions of the redistribution layer 142. The underbump metal layers 160 may be disposed on first openings h1, respectively, and may be electrically connected to the first electrical connection metals 170, respectively.

The first electrical connection metals 170 may serve to physically and/or electrically connect the semiconductor package 100 to an external apparatus such as a mainboard of an electronic device. The first electrical connection metal 170 may be formed of a low melting point metal, for example, a solder such as tin (Sn)-aluminum (Al)-copper (Cu), or the like. The first electrical connection metal 170 may be a single layer or multiple layers. For example, the multiple layers may include a copper pillar and a solder, and the single layer may include a tin-silver solder or copper.

Figure 11:
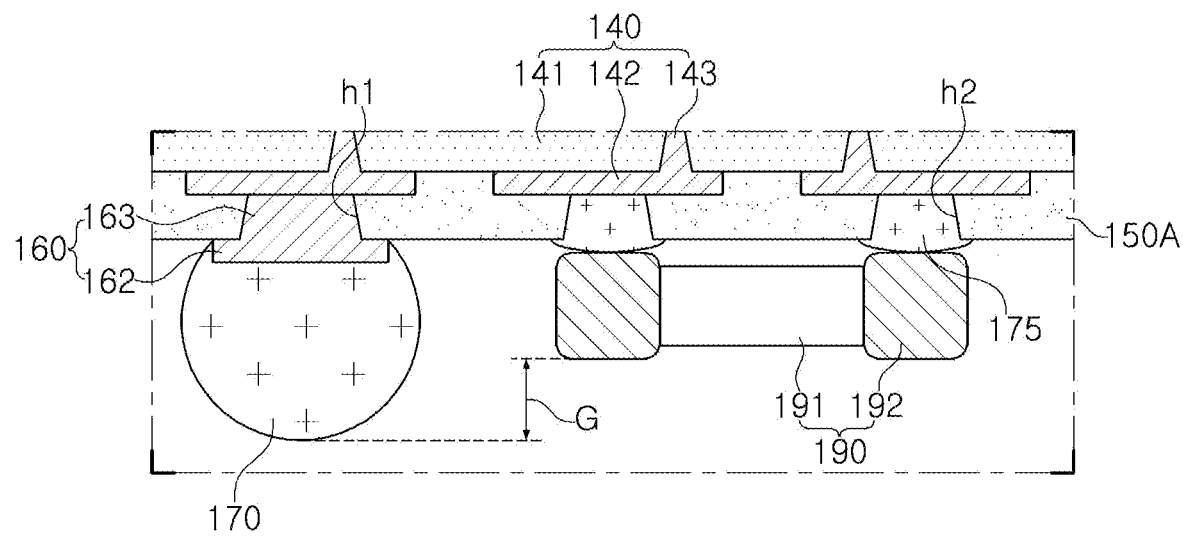
FIG. 11 is an enlarged cross-sectional view of region "A1" of the semiconductor package of FIG. 9.

A case in which the first electrical connection metal 170 has a ball shape is exemplified, but the first electrical connection metal 170 may have another structure having a predetermined height, such as a land or a pin. Therefore, a predetermined mounting space may be secured on a lower surface of the first passivation layer 150A by a height of the first electrical connection metal 170, and the surface mount component 190 may be mounted, as illustrated in FIGS. 9 and 11. The surface mount component 190 may include various types of surface mount components as well as passive components such as a capacitor and an inductor. The surface mount component 190 may include an element body 191 and a plurality of connection terminals 192 for external connection.

The surface mount component 190 may be electrically connected to the connection pads 122 of the semiconductor chip 120 through the redistribution layers 142 of the connection structure 140. However, such a mounting space may be limited by the height of the first electrical connection metal 170. Particularly, a gap G between the height of the first electrical connection metal 170 and a height of the surface mount component 190 need to be sufficiently secured. For example, damage to the surface mount component 190 disposed on a mounting surface of the semiconductor package 100 may be easily generated due to deformation of the first electrical connection metal caused by a reflow process or deformation of the semiconductor package due to warpage. In addition, recently, the semiconductor package 100 requires many components such as passive elements, and a mounting space thus need to be sufficiently secured.

In the present exemplary embodiment, a method of sufficiently securing the gap G between the height of the first electrical connection metal 170 and the height of the surface mount component 190 by lowering a mounting height of the surface mount component 190 is suggested in order to solve such a problem.

In detail, as illustrated in FIG. 11, in addition to the first openings h1 for the underbump metal layers 160, a plurality of second openings h2 in which one region of the redistribution layer 142 is opened may be additionally formed in the first passivation layer 150A. The plurality of second openings h2 may be provided in an amount and at positions corresponding to those of connection terminals 192 of the surface mount component 190 that is to be mounted on the lower surface of the first passivation layer 150A. The plurality of second openings h2 are not limited thereto, and in some exemplary embodiments, at least some of the plurality of second openings h2 may be positioned in a region overlapping the semiconductor chip 120 in a plan view of the semiconductor package 100.

The second electrical connection metals 175 may be filled in the plurality of openings h2, respectively, so as to be connected to the redistribution layer 142. The surface mount component 190 may be disposed on the first passivation layer 150A, and the connection terminals 192 of the surface mount component 190 may be connected to the redistribution layer 142 by the respective second electrical connection metals 175.

According to one aspect of the present disclosure, the plurality of first and second electrical connection metals 170 and 175 are disposed on different height levels from each other in a stacking direction. In other words, the plurality of first electrical connection metals 170 are disposed below a height level of the first passivation layer 150A in the stacking direction, and the plurality of second electrical connection metals 175 are disposed on a same height level as the height level of the passivation layer 150A in the stacking direction. As such, the gap G between the height of the first electrical connection metal 170 and the height of the surface mount component 190 can be sufficiently large enough to prevent damage to the surface mount component 190.

In the present exemplary embodiment, a thickness of the second electrical connection metal 175 is slightly greater than a thickness of the first passivation layer by embedding an internal space of the second opening h2 in order to be stably connected to the surface mount component 190, but the second electrical connection metal 175 is not limited thereto. In some exemplary embodiments, the second electrical connection metal 175 may fill only at least a portion of the second opening h2 as long as electrical and mechanical connection between the second electrical connection metal 175 and the connection terminal 192 of the surface mount component 190 may be ensured (for example, when a portion of the connection terminal may be inserted into the second opening).

The second electrical connection metal 175 may be formed of a low melting point metal that is similar to or the same as that of the first electrical connection metal 170, for example, a solder such as tin (Sn)-aluminum (Al)-copper (Cu), or the like, but may be formed of a low melting point metal different from that of the first electrical connection metal 170 in some exemplary embodiments. In addition, the second electrical connection metal 175 may be used in a paste form in order to be effectively filled.

In the present exemplary embodiment, a case in which the number of surface mount components 190 is one is exemplified for convenience of explanation, but a plurality of surface mount components may be mounted on a mounting surface of the semiconductor package, that is, the lower surface of the first passivation layer, in a manner similar to the manner described above.

As described above, underbump metal layers associated with the surface mount component may be omitted, such that a mounting height of the surface mount component 190 may be lowered by a thickness of the underbump metal layers, and required second electrical connection metals 175 may be positioned in the internal spaces of the second openings h2, such that mounting height of the surface mount component 190 may be additionally lowered.

Resultantly, a problem of the mounting space due to a low height of the first electrical connection metals 170 of the semiconductor package 100 may be solved, and utilization of the mounting surface of the semiconductor package 100 may be improved. In addition, this process may be easily implemented using an existing process, and a detailed description therefor will be described below (see FIGS. 13A through 13D).

Main components of the semiconductor package 100 according to the present exemplary embodiment will hereinafter be described in more detail.

The frame 110 may improve rigidity of the semiconductor package 100 depending on certain materials, and serve to secure uniformity of a thickness of the encapsulant 130. When wiring layers 112a, 112b, 112c, and 112d, wiring vias 113a, 113b, and 113c, and the like, are formed in the frame 110, the semiconductor package 100 may be utilized as a package-on-package (POP) type package. The frame 110 may have the cavity 110H. The semiconductor chip 120 may be disposed in the cavity 110H to be spaced apart from the frame 110 by a predetermined distance. Side surfaces of the semiconductor chip 120 may be surrounded by the frame 110. However, such a form is only an example and may be variously modified to have other forms, and the frame 110 may perform another function depending on such a form.

The frame 110 may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122. The first to third wiring layers 112a, 112b, and 112c may be electrically connected to each other through first and second wiring vias 113a and 113b each penetrating through the first to second insulating layers 111a and 111b.

When the first wiring layer 112a is embedded in the first insulating layer 111a as in the present exemplary embodiment, a step generated due to a thickness of the first wiring layer 112a may be significantly reduced, and an insulating distance of the connection structure 140 may thus become constant. The first wiring layer 112a may be recessed in the first insulating layer 111a, such that a lower surface of the first insulating layer 111a and a lower surface of the first wiring layer 112a may have a step therebetween. In this case, a phenomenon in which a material of an encapsulant 130 bleeds to pollute the first wiring layer 112a may be prevented. The frame 110 may be manufactured at a sufficient thickness by a substrate process, or the like, while the connection structure 140 may be manufactured at a small thickness by a semiconductor process, or the like. Therefore, a thickness of each of the first to third wiring layers 112a, 112b, and 112c of the frame 110 may be greater than that of each of the redistribution layers 142 of the connection structure 140.

A material of each of the first and second insulating layers 111a and 111b may be, for example, a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. In some exemplary embodiments, a PID resin may also be used as the material of the each of the first and second insulating layers 111a and 111b. In terms of maintenance of rigidity, the prepreg may be used as the material of each of the first and second insulating layers 111a and 111b.

The first to third wiring layers 112a, 112b, and 112c may serve to redistribute the connection pads 122 of the semiconductor chip 120. Each of the first to third wiring layers 112a, 112b, and 112c may include a conductive material such as copper (Cu), aluminum (Al), silver (Ag), tin (Sn), gold (Au), nickel (Ni), lead (Pb), titanium (Ti), or alloys thereof. The first to third wiring layers 112a, 112b, and 112c may perform various functions depending on designs of corresponding layers. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112a, 112b, and 112c may include via pads, wire pads, ball pads, and the like.

The first and second wiring vias 113a and 113b may electrically connect the first to third wiring layers 112a, 112b, and 112c formed on different layers to each other to form a wiring structure having an electrical path in a vertical direction within the frame 110. A material of each of the first and second wiring vias 113a and 113b may be the conductive material described above. Each of the first and second wiring vias 113a and 113b may be a filled-type via filled with the conductive material, or be a conformal-type via in which the conductive material may be formed along a wall of each of via holes. Meanwhile, depending on a process, the first and second wiring vias 113a and 113b may have tapered shapes of which directions are the same as each other, that is, tapered shapes of which widths of upper portions are greater than those of lower portions, in relation to a cross section. When the first and second wiring vias 113a and 113b are formed by the same plating process, the first and second wiring vias 113a and 113b may be integrated with the second and third wiring layers 112b and 112c.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. For example, the IC may be a memory chip such as a volatile memory (for example, a DRAM), a non-volatile memory (for example, a ROM), a flash memory, or the like, a logic chip such as an analog-to-digital converter, an application-specific IC (ASIC), or the like, or another kind of chip such as a power management IC (PMIC), or a combination of some thereof.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 opening the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123. Therefore, the encapsulant 130 may fill at least portions of a space between the passivation layer 123 and the connection structure 140. In this case, a phenomenon in which the encapsulant 130 bleeds into the lower surface of the connection pad 122 may be prevented to some degree. An insulating layer (not illustrated), and the like, may also be further disposed in other required positions. The semiconductor chip 120 may be a bare die, and the connection pads 122 may thus be in physical contact with connection vias 143 of the connection structure 140. However, depending on a kind of semiconductor chip 120, a separate redistribution layer (not illustrated) may further be formed on an active surface of the semiconductor chip 120, and layers (not illustrated), or the like, may be connected to the connection pads 122.

The encapsulant 130 may protect the frame 110, the semiconductor chip 120, and the like. An encapsulation form of the encapsulant 130 is not particularly limited, but may be a form in which the encapsulant 130 surrounds at least portions of each of the frame 110 and the semiconductor chip 120. For example, the encapsulant 130 may cover the frame 110 and an inactive surface (a surface on which the connection pads 122 are not formed) of the semiconductor chip 120, and fill at least portions of the cavity 110H. The encapsulant 130 may fill the cavity 110H to thus serve as an adhesive and reduce buckling of the semiconductor chip 120 depending on certain materials.

A material of the encapsulant 130 may be, for example, a thermosetting resin such as an epoxy resin, a thermoplastic resin such as a polyimide resin, or a resin in which the thermosetting resin or the thermoplastic resin is mixed with an inorganic filler or is impregnated together with an inorganic filler in a core material such as a glass fiber, or the like, but is not limited thereto. In some exemplary embodiments, a material of the encapsulant 130 may be a thermosetting resin such as prepreg, ABF, FR-4, or BT or a photoimagable encapsulant (PIE) resin.

The wiring pattern layer 132 may be formed on the encapsulant 130 and be connected to the wiring structure (particularly, the third wiring layer 112c) of the frame 110. The wiring vias 133 may penetrate through at least portions of the encapsulant 130, and may electrically connect the third wiring layer 112c, which is the uppermost wiring layer of the frame 110, and the wiring pattern layer 132 to each other. A material of each of the wiring pattern layer 132 and the wiring via 133 may be the conductive material described above, and be a metal such as copper (Cu) in some exemplary embodiments. In addition, each of the wiring pattern layer 132 and the wiring via 133 may be a plurality of conductor layers including a seed layer and a plating layer.

The wiring pattern layer 132 may perform various functions depending on a design. For example, the wiring pattern layer 132 may include ground patterns, power patterns, signal patterns, and the like. The wiring via 133 may also have a tapered shape of which a width of an upper surface is greater than that of a lower surface, in relation to a cross section.

The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the first electrical connection metals 170 depending on the functions. The connection structure 140 may include insulating layers 141 in contact with the frame 110 and the semiconductor chip 120, the redistribution layers 142 disposed on the insulating layers 141, and the connection vias 143 penetrating through the insulating layers 141 and connecting the connection pads 122 and the redistribution layers 142 to each other. A case in which the connection structures 140 include three insulating layers 141 and three-layered redistribution layers 142 and connection vias 143 is exemplified in FIG. 9, but the connection structure 140 may be implemented as a single layer or two layers or as a larger number of layers than three layers in another exemplary embodiment.

A material of each of the insulating layers 141 may be a photosensitive insulating material such as a PID resin, in addition to the insulating material described above. When the insulating layer 141 has photosensitive properties, the insulating layer 141 may be formed to have a smaller thickness, and a fine pitch of the connection via 143 may be achieved more easily by a photolithography process. In some exemplary embodiments, each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. Even though the insulating layers 141 are the multiple layers, a boundary between the insulating layers 141 may also not be apparent.

The redistribution layers 142 may serve to substantially redistribute the connection pads 122, and may be formed of the conductive material described above. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like, and may include pad patterns having various shapes, if necessary.

The connection vias 143 may electrically connect the redistribution layers 142 formed on different layers, the connection pads 122, and the like, to each other, and form an electrical path in a vertical direction (interlayer electrical path) within the semiconductor package 100. A material of each of the connection vias 143 may be the conductive material described above. Each of the connection vias 143 may be completely filled with the conductive material or the conductive material may be formed along a wall of each of via holes. Meanwhile, each of the connection vias 143 of the connection structure 140 may have a tapered shape of which a direction is opposite to that of each of the first and second wiring vias 113a and 113b of the frame 110. That is, each of the connection vias 143 of the connection structure 140 may have a tapered shape of which a width of an upper surface is smaller than that of a lower surface, in relation to a cross section.

The first and second passivation layers 150A and 150B may protect the connection structure 140 from external physical or chemical damage. The first and second passivation layers 150A and 150B may include the insulating material described above. In some exemplary embodiments, the first and second passivation layers 150A and 150B may include prepreg, ABF, FR-4, BT, a solder resist, or a PID. The second passivation layer 150B may have openings H opening partial regions of the wiring pattern layer 132. A surface treatment layer 132P may be formed in the opened regions of the wiring pattern layer 132 by plating such as noble metal plating. The surface treatment layer 132P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The underbump metal layers 160 may improve connection reliability of the first electronic connection metals 170, resulting in improvement of board level reliability of the semiconductor package 100. The underbump metal layers 160 may be connected to the redistribution layer 142 of the connection structure 140 through the first openings h1 of the first passivation layer 150A, as described above. The underbump metal layers 160 may be formed in the first openings h1 of the first passivation layer 150A by any known metallization method using any known conductive material such as a metal, but are not limited thereto.

The number, an interval, a disposition, or the like, of first electrical connection metals 170 are not particularly limited, but may be sufficiently modified by a person skilled in the art depending on design particulars. For example, the first electrical connection metals 170 may be provided in an amount of several tens to several thousands according to the number of connection pads 122, or may be provided in an amount of several tens to several thousands or more or several tens to several thousands or less. When the first electrical connection metals 170 are solder balls, the first electrical connection metals 170 may cover side surfaces of the underbump metal layers 160 extending onto one surface of the first passivation layer 150A, and may improve connection reliability. At least one of the first electrical connection metals 170 may be disposed in a fan-out region. The fan-out region refers to a region except for a region overlapping the semiconductor chip 120 in a plan view of a semiconductor package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

In addition, although not illustrated in FIG. 9, a plurality of semiconductor chips 120 performing functions that are the same as or different from each other may be disposed in the cavity 110H. In some exemplary embodiments, a separate passive component such as an inductor, a capacitor, or the like, may be disposed in the cavity 110H. In addition, in some exemplary embodiment, a plurality of cavities 110H may be formed, and semiconductor chips 120 and/or passive components may be disposed in the cavities 110H, respectively. A metal layer may be formed on walls of the cavity 110H, if necessary, in order to dissipate heat and block electromagnetic waves.

An example of a method of manufacturing a semiconductor package according to the present exemplary embodiment will hereinafter be described in detail. A method of manufacturing the semiconductor package 100 illustrated in FIG. 9 will be divided into and described as processes (FIGS. 12A through 12E) of forming a package body and processes (FIGS. 13 through 13D) of mounting a surface mount component.

FIGS. 12A through 12E are cross-sectional views for describing main processes of a method of manufacturing a semiconductor package according to an exemplary embodiment in the present disclosure.

Figure 12A:
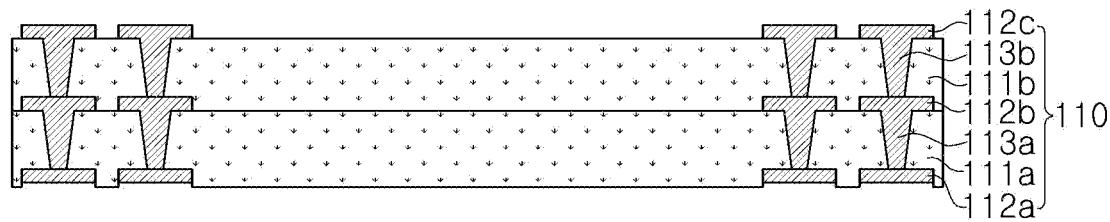
FIGS. 12A through 12E are cross-sectional views for describing main processes of a method of manufacturing a semiconductor package according to an exemplary embodiment in the present disclosure.

Referring to FIG. 12A, the frame 110 having the wiring structure may be prepared.

The frame 110 may be manufactured using a coreless substrate by the following method. In detail, the frame 110 may be prepared by repeating a series of processes forming the first wiring layer 112a on the coreless substrate by a plating process, forming the first insulating layer 111a by laminating ABF, or the like, forming laser via holes in the first insulating layer 111a using some pad patterns of the first wiring layer 112a as stoppers, and forming the second wiring layer 112b and the first wiring vias 113a by a plating process, and then separating and removing the coreless substrate. A metal layer remaining on a lower surface of the frame 110 after the coreless substrate is separated may be removed by etching. In this metal layer removing process, a step may be formed between a lower surface of the first insulating layer 111a and a lower surface of the first wiring layer 112a of the frame 110.

Figure 12B:
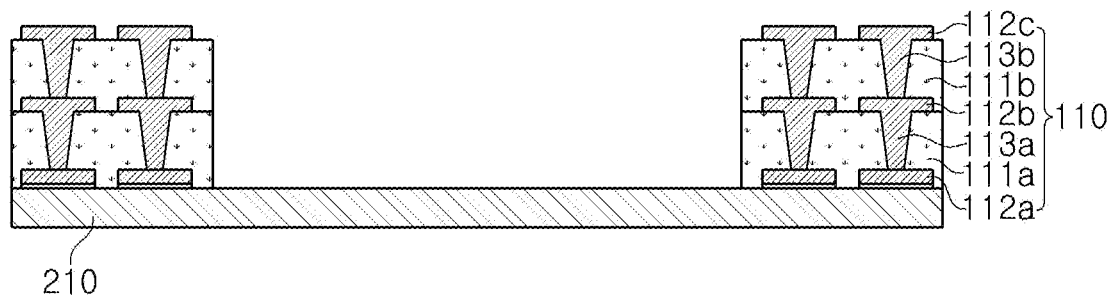
Figure 12C:
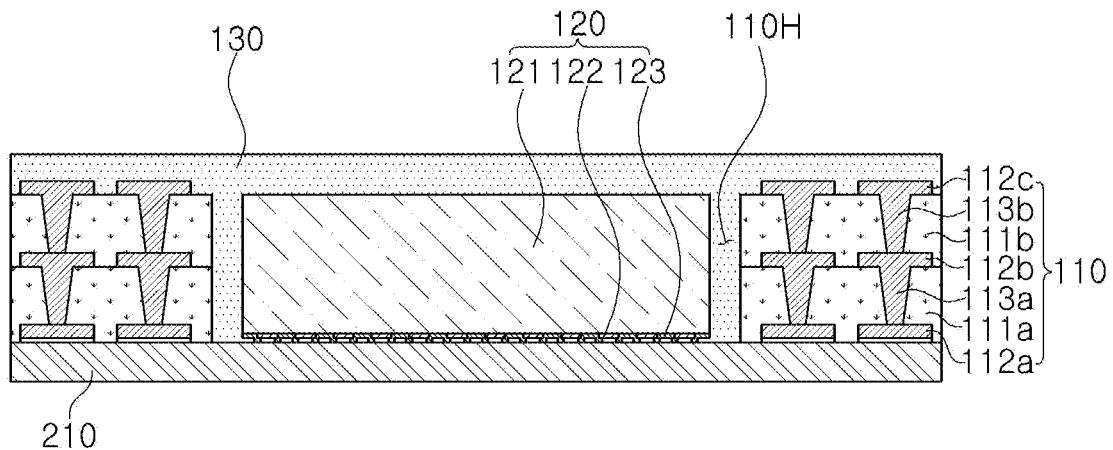

Then, as illustrated in FIG. 12B, the cavity 110H may be formed in the frame 110, and an adhesive film 210 may be attached to the frame 110. Then, as illustrated in FIG. 12C, the semiconductor chip 120 may be disposed in the cavity 110H, and the encapsulant 130 may be formed.

The cavity 110H may be formed in the frame 110 by a laser and/or mechanical drill or a sandblast process. The adhesive film 210 may be attached to a lower surface of the frame 110. For example, the adhesive film 210 may be a tape or the like including an epoxy resin. The semiconductor chip 120 may be mounted in a region of the cavity 110H corresponding to the adhesive film 210, and the encapsulant 130 encapsulating the semiconductor chip 120 may be formed using an appropriate encapsulating material. A process of forming the encapsulant 130 may be performed by a lamination process using ABF or a process of applying a liquid resin.

Figure 12D:
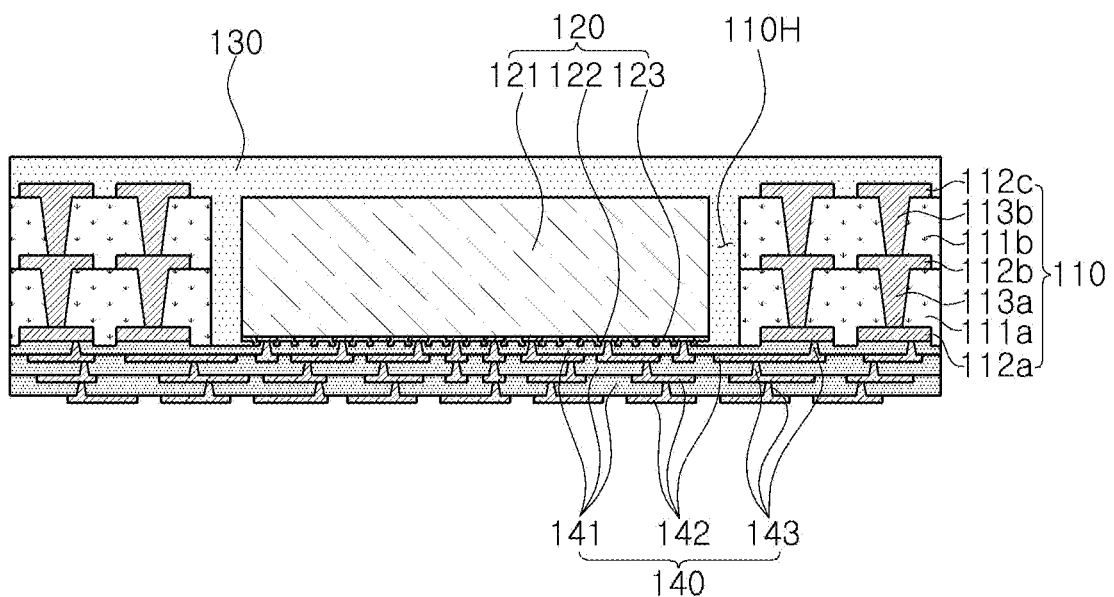

Then, referring to FIG. 12D, the adhesive film 210 may be removed, and the connection structure 140 may be formed in a region in which the adhesive film 210 is removed.

The connection structure 140 may be formed by repeating a series of processes of forming the insulating layer 141 by PID coating, forming via holes in the insulating layer 141 by a photolithography process, and forming the redistribution layer 142 and the connection vias 143 by a plating process. As described, when the insulating layer 141 formed of PID and the photolithography are used, a fine pitch may be easily implemented.

Figure 12E:
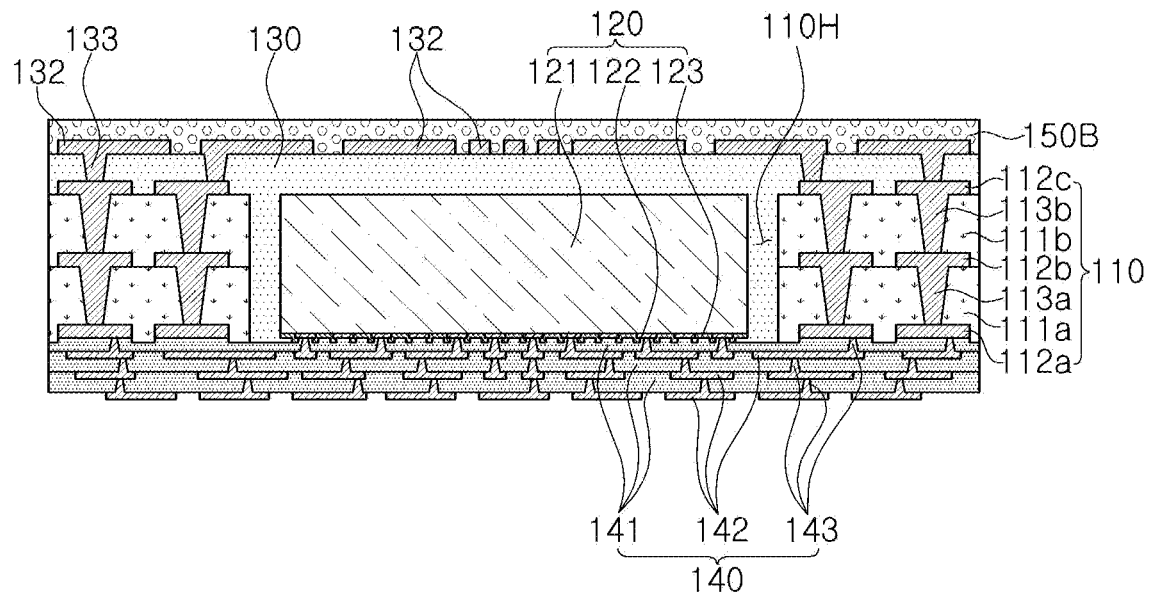

Then, referring to FIG. 12E, the wiring pattern layer 132 may be formed on the encapsulant 130.

In order to form the wiring pattern layer 132, holes connected to the wiring structure (particularly, the third wiring layer 112c) of the frame 110 may be first formed in the encapsulant 130. A drilling method of forming the holes may be selected depending on materials of the encapsulant 130 and the wiring pattern layer 132. For example, when the encapsulant 130 is a non-photosensitive insulating layer such as ABF, the holes may be formed by laser drilling using the third wiring layer 112c as a stopper layer. After the holes are formed, appropriate clearing may be performed on a material of the encapsulant 130. For example, when the encapsulant 130 is the non-photosensitive insulating layer such as the ABF, the material of the encapsulant 130 may be cleared by a desmear process. Then, a dry film may be patterned, and the wiring pattern layer 132 and the wiring vias 133 may be formed by a plating process using the dry film. Then, the second passivation layer 150B may be formed on the encapsulant 130 so as to cover the wiring pattern layer 132, if necessary. For example, the second passivation layer 150B may be formed by an ABF lamination process.

FIGS. 13A through 13D illustrate processes of mounting a surface mount component in the method of manufacturing a semiconductor package according to an exemplary embodiment in the present disclosure.

Figure 13A:
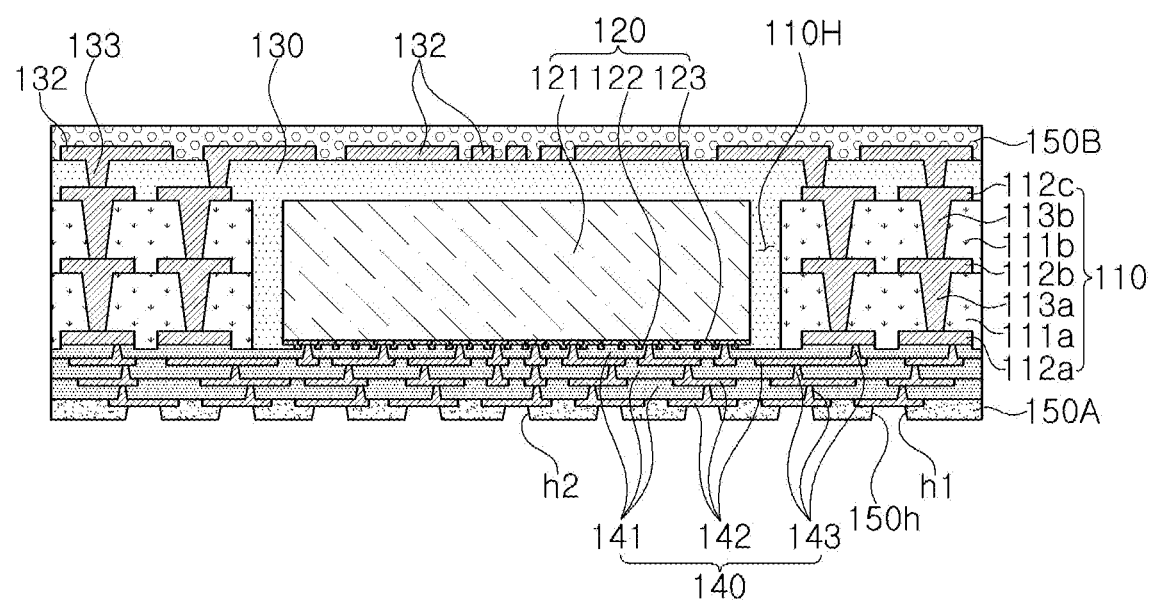
FIGS. 13A through 13D are plan views for describing main processes of mounting a surface mount component according to an exemplary embodiment in the present disclosure.

Referring to FIG. 13A, the first passivation layer 150A may be formed on the second surface of the connection structure 140, and the plurality of first and second openings h1 and h2 may be formed in the first passivation layer 150A.

The first passivation layer 150A may be formed by ABF lamination, and may be formed together with the second passivation layer 150B or be formed after the second passivation layer 150B is formed. The plurality of first openings h1 and the plurality of second openings h2 may be formed to open one region of the redistribution layer 142, respectively, and may be formed by a process such as a laser drill process or the like. The plurality of first openings h1 may define regions in which the first electrical connection metals 170 connected to an external circuit will be formed, and the plurality of second openings h2 may define regions to which the connection terminals of the surface mount component 190 will be connected.

Figure 13B:
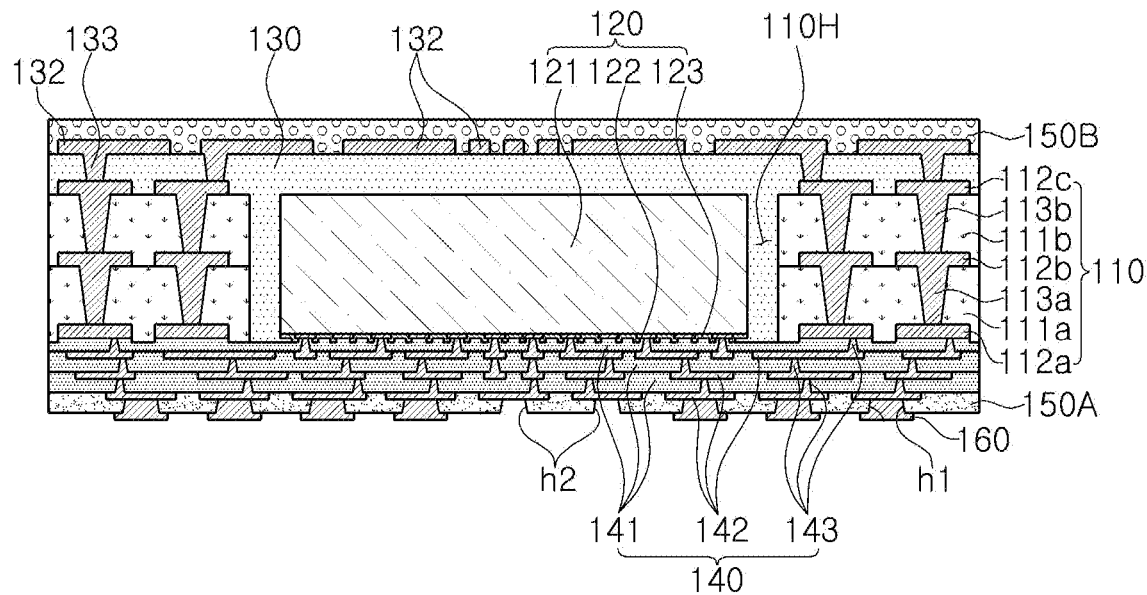

Then, referring to FIG. 13B, a plurality of underbump metal layers 160 may be formed in the first openings h1 of the first passivation layer 150A.

The underbump metal layers 160 may be formed in the first openings h1 of the first passivation layer 150A to be connected to one region of the redistribution layer 142. For example, the underbump metal layers 160 may be formed by any known metallization method. In a process according to the present exemplary embodiment, the underbump metal layers 160 are not formed in the second openings h2. Therefore, internal spaces of the second openings h2 may be maintained as empty spaces.

Figure 13C:
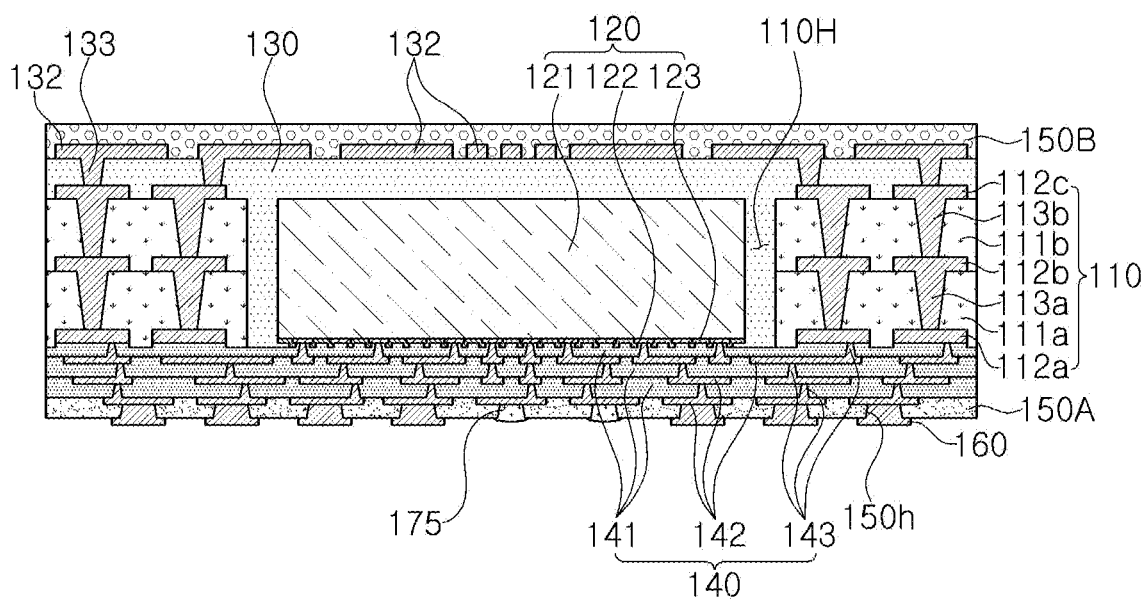

Then, referring to FIG. 13C, the second electrical connection metals 175 may be formed in the second openings h2 of the first passivation layer 150A.

The second electrical connection metals 175 may be filled in the plurality of openings h2, respectively, to be connected to the redistribution layer 142. In the present exemplary embodiment, a thickness of the second electrical connection metals 175 is slightly greater than a thickness of the first passivation layer 150A, but the second electrical connection metals 175 may fill only portions of the second openings h2, if necessary. The second electrical connection metals 175 may be formed of a low melting point metal, for example, a solder such as tin (Sn)-aluminum (Al)-copper (Cu), or the like, and may be manufactured and used in a paste form in order to be effectively filled.

Figure 13D:
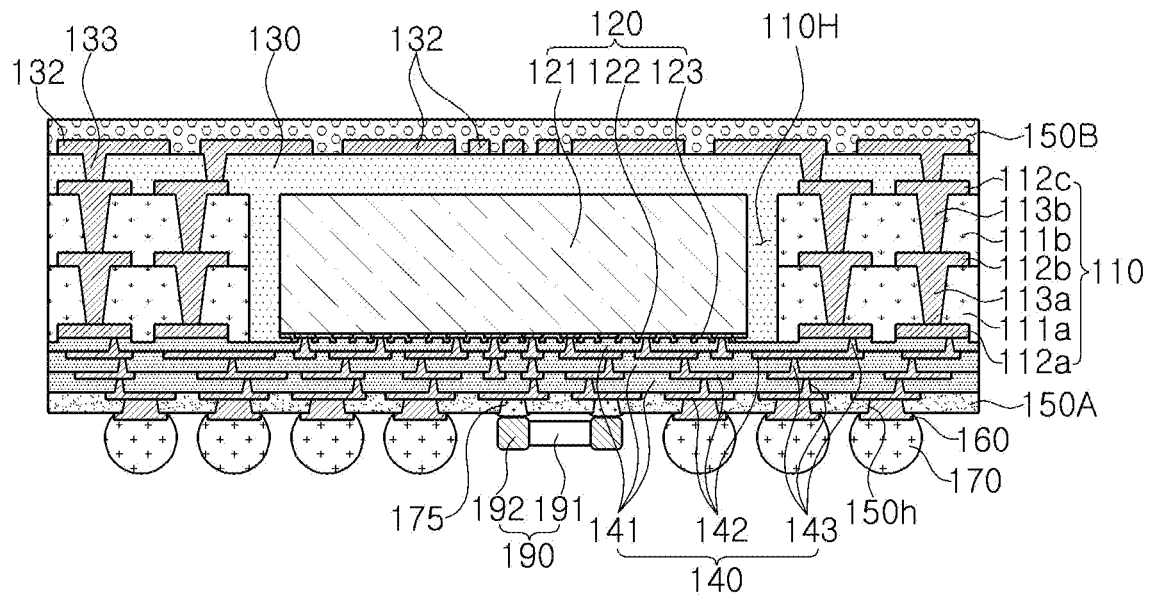

Then, referring to FIG. 13D, the first electrical connection metals 170 may be formed on the lower surface of the first passivation layer 150A, and the surface mount component 190 may be mounted using the second electrical connection metals 175.

The first electrical connection metals 170 may be formed on the underbump metal layers 160 to be connected to the redistribution layer 142, and may be formed of a low melting point metal that is similar to or the same as that of the second electrical connection metals 175, but may be formed of another metal or be used in another form. The surface mount component 190 may be disposed on the first passivation layer 150A, and the connection terminals 192 of the surface mount component 190 may be connected to the redistribution layer 142 by the respective second electrical connection metals 175.

The series of processes described above may be performed using a frame 110 having a large size, that is, a panel size. In this case, a plurality of fan-out semiconductor packages 100 may be formed through the frame 110 having the panel size, and when the plurality of fan-out semiconductor packages 100 are separated from one another by a dicing process, the plurality of fan-out semiconductor packages 100 may be obtained by performing the processes once.

As described above, underbump metal layers associated with the surface mount component may be omitted, such that a mounting height of the surface mount component 190 may be lowered by a thickness of the underbump metal layers, required second electrical connection metals 175 may be positioned in the internal spaces of the second openings h2, such that mounting height of the surface mount component 190 may be additionally lowered, and a series of manufacturing processes for this purpose may be easily implemented using an existing process.

Figure 14:
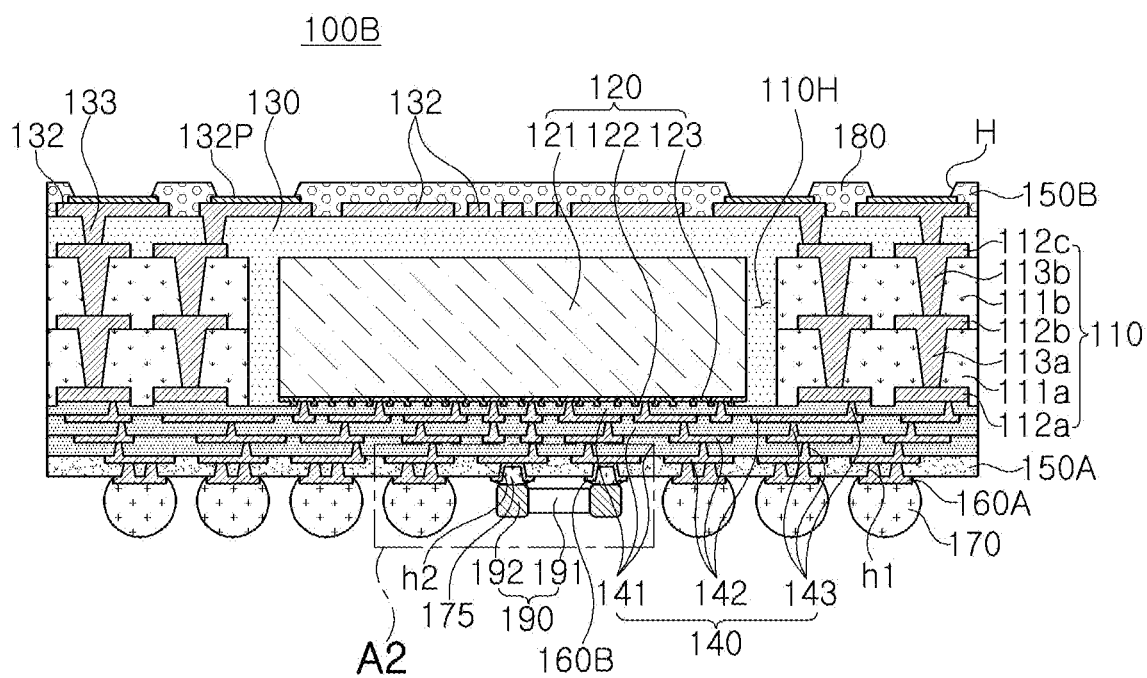
FIG. 14 is a schematic cross-sectional view illustrating a semiconductor package according to another exemplary embodiment in the present disclosure.

FIG. 14 is a schematic cross-sectional view illustrating a semiconductor package according to another exemplary embodiment in the present disclosure.

Referring to FIG. 14, it may be understood that a semiconductor package 100A according to the present exemplary embodiment has a structure similar to that illustrated in FIGS. 9 through 11 except that second underbump metal layers 175 are conformally formed in second openings h2. Components according to the present exemplary embodiments may be understood with reference to the description for the same or similar components of the semiconductor package 100 illustrated in FIGS. 9 through 11 unless explicitly described otherwise.

The semiconductor package 100A according to the present exemplary embodiment may include underbump metal layers 160B connected to a redistribution layer 142 and conformally formed along bottom surfaces and sidewalls of the second openings h2.

Since the second underbump metal layer 160B is conformally formed along the bottom surface and the sidewall of the second opening h2, an empty space of the second opening h2 is not completely filled, such that the second underbump metal layer 160B may have a concave portion g. The concave portion g may be used as a space in which a second electrical connection metal 175 is filled, similar to the exemplary embodiment illustrated in FIG. 9. Therefore, a mounting height of a surface mount component 190 may be lowered by a thickness of the filled second electrical connection metal 175 to secure a sufficient gap G.

In the present exemplary embodiment, a case in which the second electrical connection member 175 substantially completely embeds the concave portion g of the second underbump metal layer 160B is exemplified, but in another exemplary embodiment, the second electrical connection member 175 may fill only at least a portion of the concave portion g of the second underbump metal layer 160B.

The second underbump metal layer 160B may include the same metal as that of the first underbump metal layer 160A, but is not limited thereto. In some exemplary embodiments, the second underbump metal layer 160B may be formed by the same metallization process as the metallization process of forming the first underbump metal layer 160A.

Figure 15:
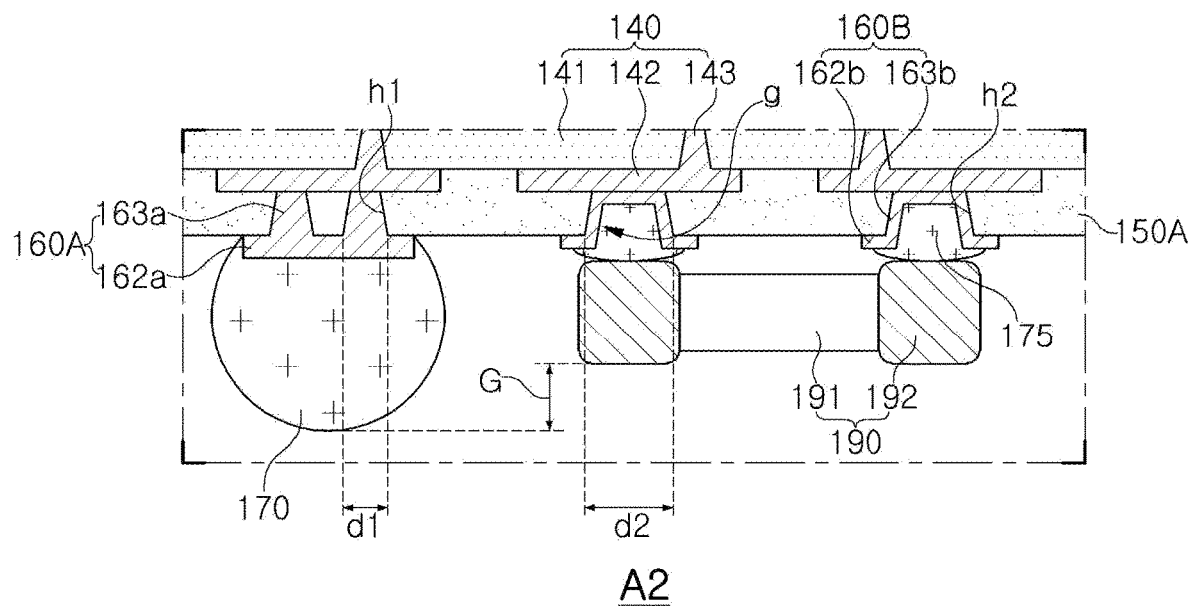
FIG. 15 is an enlarged cross-sectional view of region "A2" of the semiconductor package of FIG. 14.

First and second openings h1 and h2 used in the present exemplary embodiment may have different sizes. As illustrated in FIG. 15, a diameter d2 of the second opening h2 may be greater than a diameter d1 of the first opening h1. The sizes of the first and second openings are adjusted, such that even though the first and second underbump metal layers 160A and 160B are simultaneously formed by a single process, the concave portion g may be selectively provided in only the second underbump metal layer 160B. In detail, in a process of forming UBMs, the first opening h1 having the small diameter d1 is comparatively rapidly filled, such that the first underbump metal layer 160A having a desired structure may be formed, but the second underbump metal layer 160B formed in the second opening h2 having the great diameter d2 at the same point in time may have the concave portion g still existing in the second opening h2 in a state in which it is conformally formed.

As described above, the sizes of the first and second openings are adjusted, such that the first and second underbump metal layers 160A and 160B having different forms may be simultaneously formed by a single process. To this end, the first and second openings h1 and h2 may have a sufficient diameter difference (for example, 50 µm or more) therebetween. For example, the diameter d1 of the first opening h1 may be 100 µm or less, and the diameter d2 of the second opening h2 may be 150 µm or more.

Such a size difference may be easily secured by forming a plurality of first openings h1 associated with one first underbump metal layer 160A.

Figure 16:
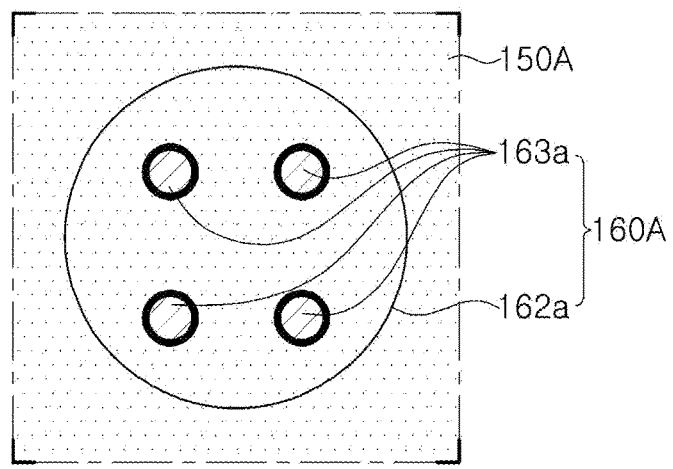
FIG. 16 is a plan view illustrating a structure of a first underbump metal (UBM) layer used in the semiconductor package of FIG. 14.

Referring to FIG. 16, a plane structure of the first underbump metal layer 160A used in the present exemplary embodiment is illustrated. Four UBM vias 163a connected to the redistribution layer 142 may be arranged on a UBM pad 162a formed on a first passivation layer 150A. In this via arrangement, even though a diameter of each of individual UBM vias 163a is reduced, a sufficient connection area may be secured, and stress may be dispersed through a plurality of UBM vias 163a to improve board level reliability of the semiconductor package 100A.

The second underbump metal layer 160B may have a portion 162b extending up to an upper surface of the first passivation layer 150A positioned in the vicinity of the second opening h2 as well as a portion 163b positioned on an inner surface of the second opening h2. In addition, a portion of the second electrical connection metal 175 may be disposed on the extending portion 162b.

As described above, a connection area with a connection terminal 192 may be increased by the extending portion 162b of the second underbump metal layer 160B and the second electrical connection metal 175 disposed on the extending portion 162b, and firmer mounting of the surface mount component 190 may thus be secured.

FIGS. 17A through 17D illustrates processes of mounting a surface mount component in the method of manufacturing a semiconductor package according to another exemplary embodiment in the present disclosure.

Figure 17A:
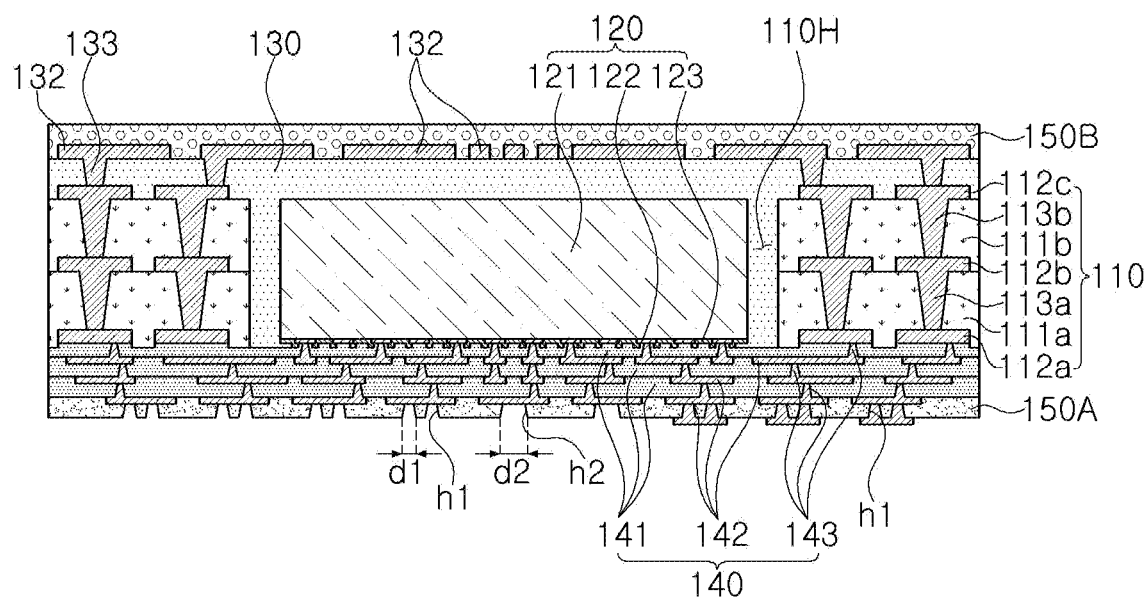
FIGS. 17A through 17D are plan views for describing main processes of mounting a surface mount component according to another exemplary embodiment in the present disclosure.

Referring to FIG. 17A, a first passivation layer 150A may be formed on a second surface of a connection structure 140, and a plurality of first and second openings h1 and h2 may be formed in the first passivation layer 150A.

This process may be performed, similar to the process according to the previous exemplary embodiment (FIG. 13A). However, in the process according to the present exemplary embodiment, the first and second openings h1 and h2 may be formed to have different sizes. The second opening h2 may be formed to have the diameter d2 greater than the diameter d1 of the first opening h1, and the plurality of first openings h1 associated with one underbump metal layer 160B may be formed. As described above, the sizes of the first and second openings are adjusted, such that the first and second underbump metal layers 160A and 160B having different forms may be simultaneously formed in the subsequent process. To this end, the first and second openings h1 and h2 may have the sufficient diameter difference (for example, 50 µm or more) therebetween. For example, the diameter d1 of the first opening h1 may be 100 µm or less, and the diameter d2 of the second opening h2 may be 150 µm or more.

Figure 17B:
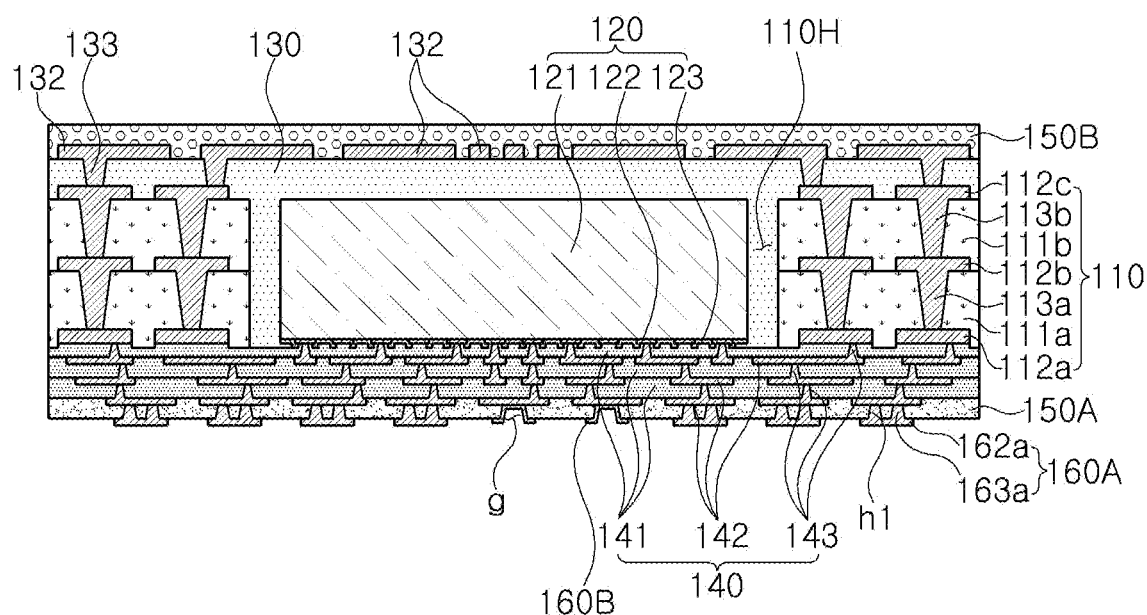

Then, referring to FIG. 17B, the first and second underbump metal layers 160A and 160B may be formed in the first and second openings h1 and h2 of the first passivation layer 150A, respectively.

Unlike the previous exemplary embodiment, the underbump metal layer may be formed in the second opening h2 as well as in the first opening h1. The second underbump metal layer 160B may be conformally formed along the bottom surface and the sidewall of the second opening h2 to have the concave portion g existing in the second opening h2, while the first underbump metal layer 160A may be formed to have a desired form by complete filling of the first opening h1.

In the present exemplary embodiment, the first and second underbump metal layers 160A and 160B may be simultaneously formed. Due to the diameter difference between the first and second openings h1 and h2, at any point in time, the first opening h1 having the small diameter d1 is completely filled, such that the desired first underbump metal layer 160 may be formed, but the second opening h2 having the great diameter d2 is not completely filled, such that the second underbump metal layer 160B may have the concave portion g.

Figure 17C:
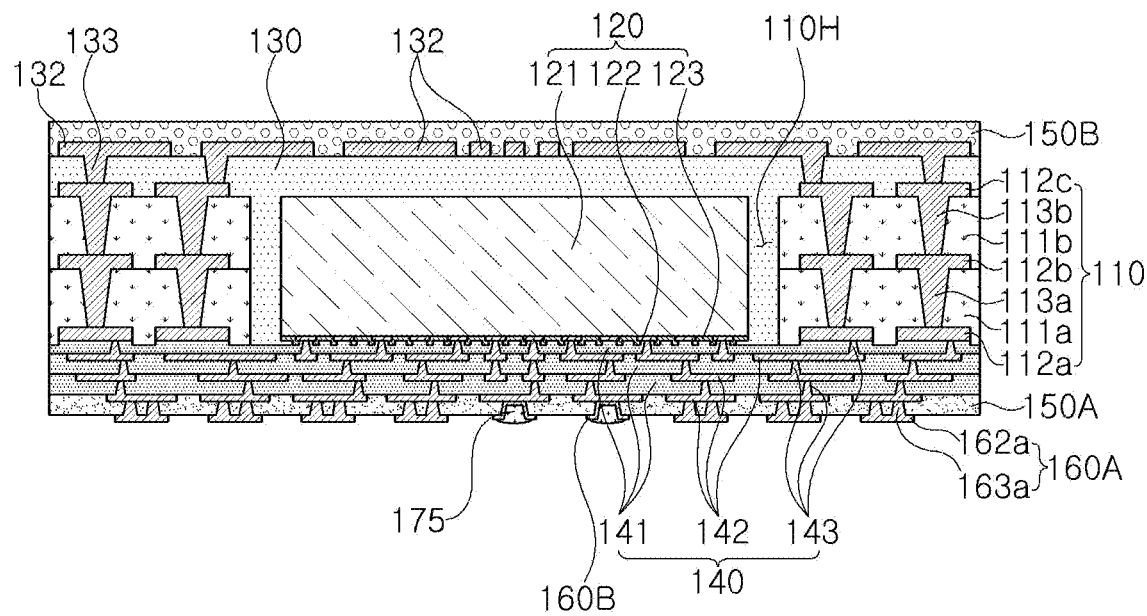

Then, referring to FIG. 17C, the second electrical connection metals 175 may be formed on the second underbump metal layers 160B of the first passivation layer 150A.

The second electrical connection metal 175 may be filled in the concave portion g (see FIG. 17B) of the second underbump metal layer 160B. The second electrical connection metal 175 may be connected to the redistribution layer 142 by the second underbump metal layer 160B. In the present exemplary embodiment, since the second electrical connection metal 175 is filled in the concave portion g, a mounting height of the surface mount component 190 may be lowered by a thickness of the filled second electrical connection metal 175 to secure a sufficient gap G. The second electrical connection metals 175 may be formed of a low melting point metal, for example, a solder such as tin (Sn)-aluminum (Al)-copper (Cu), or the like, and may be manufactured and used in a paste form in order to be effectively filled.

Figure 17D:
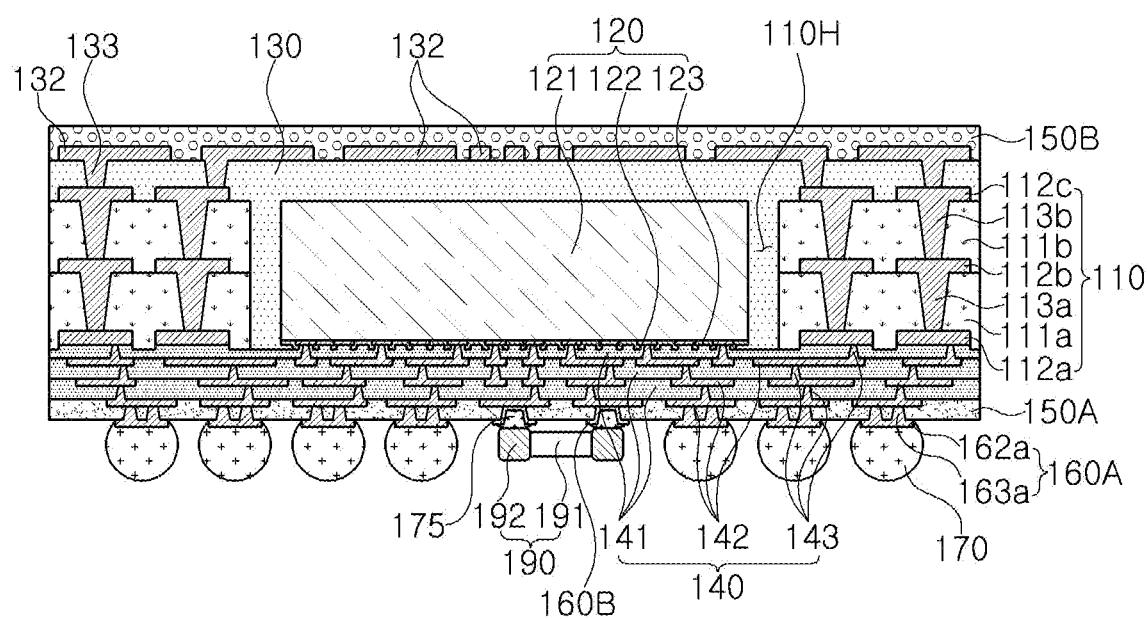

Then, referring to FIG. 17D, first electrical connection metals 170 may be formed on a lower surface of the first passivation layer 150A, and the surface mount component 190 may be mounted using the second electrical connection metals 175.

The first electrical connection metals 170 may be formed on the first underbump metal layers 160A to be connected to the redistribution layer 142, and may be formed of a low melting point metal that is similar to or the same as that of the second electrical connection metals 175, but may be formed of another metal or be used in another form. The surface mount component 190 may be disposed on the first passivation layer 150A, and the connection terminals 192 of the surface mount component 190 may be connected to the redistribution layer 142 by the respective second electrical connection metals 175 and the second underbump metal layers 160B.

The series of processes described above may be performed using a frame 110 having a large size, that is, a panel size. In this case, a plurality of fan-out semiconductor packages 100A may be formed through the frame 110 having the panel size, and when the plurality of fan-out semiconductor packages 100A are separated from one another by a dicing process, the plurality of fan-out semiconductor packages 100A may be obtained by performing the processes once.

As described above, the second underbump metal layer 160B associated with the surface mount component 190 may be formed to have the concave portion g, such that a mounting height of the surface mount component 190 may be lowered by a thickness of the second electrical connection metal 175 filled in the concave portion. In addition, a series of manufacturing processes for this purpose may be easily implemented using an existing process.

Figure 18:
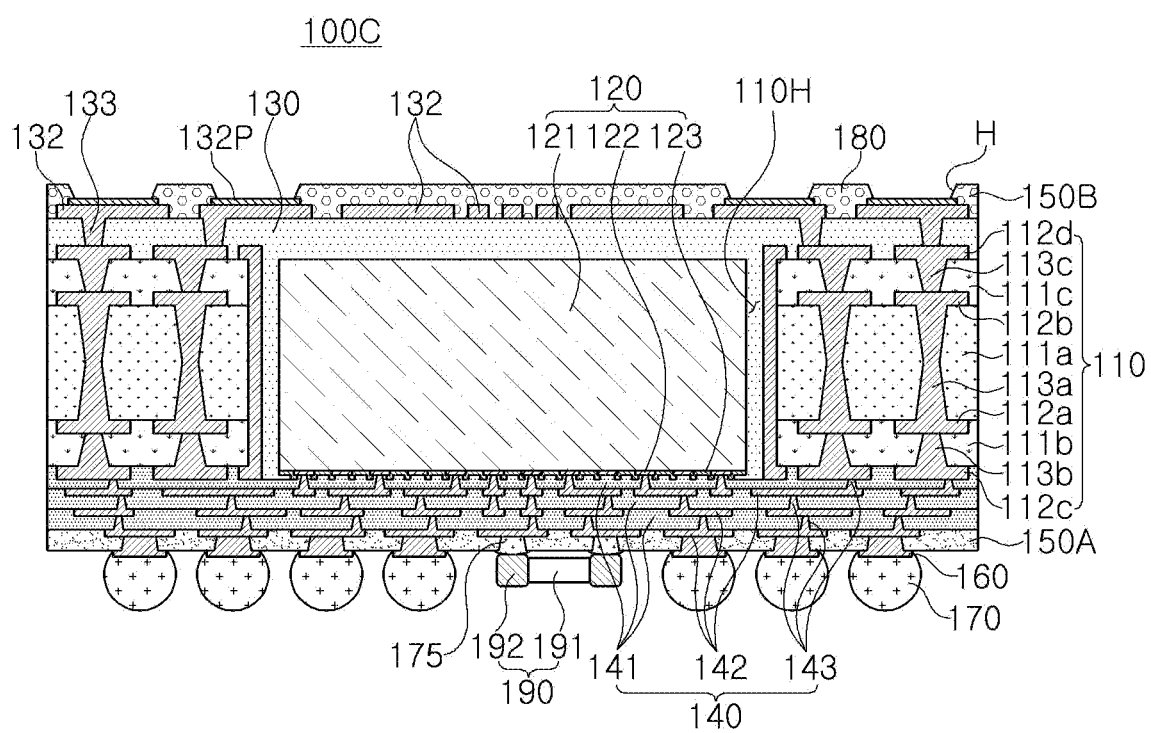
FIG. 18 is a schematic cross-sectional view illustrating a semiconductor package according to another exemplary embodiment in the present disclosure.

Referring to FIG. 18, it may be understood that a semiconductor package 100B according to the present exemplary embodiment has a structure similar to that illustrated in FIGS. 9 through 12E except for a form of a wiring structure of a frame 110. Components according to the present exemplary embodiments may be understood with reference to the description for the same or similar components of the semiconductor package 100 illustrated in FIGS. 9 through 12E unless explicitly described otherwise.

A frame 110 used in the present exemplary embodiment may have a structure different from that of the frame 110 described above, and a wiring structure of the frame 110 may thus be modified. In detail, the frame 110 may include a first insulating layer 111a, a first wiring layer 112a disposed on one surface of the first insulating layer 111a, a second wiring layer 112b disposed on the other surface of the first insulating layer 111a, a second insulating layer 111b disposed on one surface of the first insulating layer 111a and covering at least portions of the first wiring layer 112a, a third wiring layer 112c disposed on the other surface of the second insulating layer 111b opposing one surface of the second insulating layer 111b in which the first wiring layer 112a is embedded, a third insulating layer 111c disposed on the outer surface of the first insulating layer 111a and covering at least portions of the second wiring layer 112b, a fourth wiring layer 112d disposed on the other surface of the third insulating layer 111c opposing one surface of the third insulating layer 111c in which the second wiring layer 112b is embedded, first wiring vias 113a penetrating through the first insulating layer 111a and electrically connecting the first and second wiring layers 112a and 112b to each other, second wiring vias 113b penetrating through the second insulating layer 111b and electrically connecting the first and third wiring layers 112a and 112c to each other, and third wiring vias 113c penetrating through the third insulating layer 111c and electrically connecting the second and fourth wiring layers 112b and 112d to each other. Since the frame 110 used in the present exemplary embodiment has a larger number of wiring layers 112a, 112b, 112c, and 112d, redistribution layers 142 of a connection structure 140 may further be simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be an ABF or a PID including an inorganic filler and an insulating resin. However, the materials of the first insulating layer 111a and the second and third insulating layers 111b and 111c are not limited thereto. Similarly, the first wiring vias 113a penetrating through the first insulating layer 111a may have a diameter greater than those of the second and third wiring vias 113b and 113c each penetrating through the second and third insulating layers 111b and 111c. In addition, the first wiring via 113a may have an hourglass shape or a cylindrical shape, while the second and third wiring vias 113b and 113c may have tapered shapes of which directions are opposite to each other. Thicknesses of the first to fourth wiring layers 112a, 112b, 112c, and 112d may be greater than those of the redistribution layers 142.

As set forth above, according to an exemplary embodiment in the present disclosure, the underbump metal layers may be omitted or be conformally formed, such that a mounting height of the surface mount component may be lowered. A problem of a mounting space due to a low height of the electrical connection metals of the semiconductor package may be solved, and utilization of a space (particularly, amounting surface) of the semiconductor package may be improved. In addition, this process may be implemented using an existing process without adding a special process.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection structure having first and second surfaces opposing each other and including a redistribution layer;
   a semiconductor chip disposed on the first surface of the connection structure and having connection pads connected to the redistribution layer;
   an encapsulant disposed on the first surface of the connection structure and encapsulating the semiconductor chip;
   a passivation layer disposed on the second surface of the connection structure and having a plurality of first and second openings to expose, respectively, first and second regions of the redistribution layer;
   a plurality of underbump metal layers connected to the first region of the redistribution layer through the plurality of first openings, respectively;
   a plurality of first electrical connection metals disposed on the passivation layer and connected to the plurality of underbump metal layers, respectively, and a plurality of second electrical connection metals disposed in at least portions of the plurality of second openings and connected to the second region of the redistribution layer, respectively, wherein the plurality of underbump metal layers include a material different from that of the plurality of second electrical connection metals.

2. The semiconductor package of claim 1, further comprising at least one surface mount component disposed on the passivation layer and having connection terminals connected to the plurality of second electrical connection metals.

3. The semiconductor package of claim 1, wherein the plurality of second electrical connection metals are respectively disposed in the plurality of second openings such that a thickness of each second electrical connection metal is greater than a thickness of the passivation layer.

4. The semiconductor package of claim 1, further comprising a plurality of additional underbump metal layers connected to the second region of the redistribution layer, respectively, and disposed along inner sidewalls of the plurality of second openings such that the plurality of additional underbump metal layers have concave portions, wherein a plurality of second electrical connection metals are disposed in at least portions of the concave portions of the plurality of additional underbump metal layers, respectively.

5. The semiconductor package of claim 1, wherein at least some of the plurality of second openings are positioned in a region overlapping the semiconductor chip in a plan view of the semiconductor package.

6. The semiconductor package of claim 1, further comprising a frame disposed on the first surface of the connection structure and having a cavity in which the semiconductor chip is disposed.

7. The semiconductor package of claim 6, wherein the frame includes a wiring structure penetrating through upper and lower surfaces thereof and connected to the redistribution layer.

8. The semiconductor package of claim 7, further comprising a wiring pattern layer disposed on the encapsulant and connected to the wiring structure.

9. A semiconductor package comprising:
a connection structure having first and second surfaces opposing each other and including a redistribution layer;
a semiconductor chip disposed on the first surface of the connection structure and having connection pads connected to the redistribution layer;
an encapsulant disposed on the first surface of the connection structure and encapsulating the semiconductor chip;
a passivation layer disposed on the second surface of the connection structure and having a plurality of first and second openings each exposing one region of the redistribution layer;
a plurality of first underbump metal layers connected to the redistribution layer through the plurality of first openings, respectively;
a plurality of second underbump metal layers connected to the redistribution layer, and disposed along inner sidewalls of the plurality of second openings such that the plurality of second underbump metal layers have concave portions and partially fill the plurality of second openings;
a plurality of first electrical connection metals disposed on the passivation layer and connected to the plurality of first underbump metal layers, respectively;
a plurality of second electrical connection metals disposed in at least portions of the concave portions of the plurality of second underbump metal layers; and
at least one surface mount component disposed on the passivation layer and having connection terminals connected to the plurality of second electrical connection metals.

10. The semiconductor package of claim 9, wherein one of the plurality of second openings has a diameter greater than that of one of the plurality of first openings.

11. The semiconductor package of claim 10, wherein the diameter of each of the plurality of first openings is 100 μm or less, and the diameter of each of the plurality of second openings is 150 μm or more.

12. The semiconductor package of claim 9, wherein one of the plurality of first underbump metal layers overlaps two or more openings of the plurality of first openings in a plan view of the semiconductor package.

13. The semiconductor package of claim 9, wherein the plurality of second underbump metal layers have extending portions extending onto regions of a lower surface of the passivation layer that are positioned in a vicinity of the second openings, respectively.

14. The semiconductor package of claim 13, wherein portions of the plurality of second electrical connection metals are disposed on the extending portions.

15. A semiconductor package comprising:
a connection structure having first and second surfaces opposing each other and including a redistribution layer;
a semiconductor chip disposed on the first surface of the connection structure and having connection pads connected to the redistribution layer;
an encapsulant disposed on the first surface of the connection structure and encapsulating the semiconductor chip;
a passivation layer disposed on the second surface of the connection structure and having a plurality of first and second openings to expose, respectively, first and second regions of the redistribution layer; and
a plurality of first underbump metal layers connected to the first region of the redistribution layer through the plurality of first openings, respectively;
a plurality of second underbump metal layers connected to the second region of the redistribution layer, and disposed along inner sidewalls of the plurality of second openings such that the plurality of second underbump metal layers have concave portions and partially fill the plurality of second openings;
a plurality of first and second electrical connection metals disposed on the second surface of the connection structure and electrically connected to the first and second regions of the redistribution layer, respectively,
wherein a lower surface of each of the plurality of first electrical connection metals is lower than a lower surface of each of the plurality of second electrical connection metals.

16. The semiconductor package of claim 15, wherein the plurality of first electrical connection metals are disposed below a height level of the passivation layer in a stacking direction, and
the plurality of second electrical connection metals are disposed on a same height level as the height level of the passivation layer in the stacking direction.

17. The semiconductor package of claim 15, further comprising at least one surface mount component disposed on the passivation layer and having connection terminals connected to the plurality of second electrical connection metals.

\* \* \* \* \*